(12) United States Patent
Choi et al.

(10) Patent No.: US 9,331,085 B2
(45) Date of Patent: May 3, 2016

(54) NON-VOLATILE MEMORY WITH IMPROVED SENSING WINDOW

(71) Applicant: Samsung Electronics Co., Ltd., Suwon-si, Gyeonggi-do (KR)

(72) Inventors: Hyun Min Choi, Uiwang-si (KR); Shin Cheol Min, Seoul (KR); Ji Hoon Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/680,524

(22) Filed: Apr. 7, 2015

(65) Prior Publication Data

US 2016/0064390 A1 Mar. 3, 2016

(30) Foreign Application Priority Data

Sep. 2, 2014 (KR) .................. 10-2014-0116373

(51) Int. Cl.
*H01L 27/01* (2006.01)
*H01L 27/12* (2006.01)
*H01L 31/0392* (2006.01)
*H01L 27/112* (2006.01)
*H01L 27/02* (2006.01)

(52) U.S. Cl.
CPC ...... *H01L 27/11206* (2013.01); *H01L 27/0207* (2013.01)

(58) Field of Classification Search
CPC .............. H01L 21/762; H01L 21/8229; H01L 21/02164; H01L 21/02326; H01L 21/76264; H01L 21/28079; H01L 21/0214; H01L 21/0257; H01L 27/07; H01L 27/1104; H01L 21/0629; H01L 27/0705; H01L 29/66; H01L 29/435; H01L 29/7816; H01L 29/106
USPC ......... 257/396, 347, 607, 350, 401, 649, 639, 257/615, 722, 745, 760, 774, E21.006, 257/E21.014, E21.042, E21.051, E21.085, 257/E21.092, E21.115, E21.126, E21.127, 257/E21.128, E21.267, E21.278, E21.293, 257/E21.32, E21.322, E21.37, E21.421, 257/E21.545, E21.561, E21.562, E21.613, 257/E21.645
See application file for complete search history.

(56) References Cited

U.S. PATENT DOCUMENTS

| | | | |
|---|---|---|---|
| 6,130,469 A | 10/2000 | Bracchitta et al. | |
| 6,963,103 B2 * | 11/2005 | Forbes | G11C 7/20 257/315 |
| 7,443,715 B2 * | 10/2008 | Forbes | G11C 7/20 365/154 |
| 7,800,146 B2 | 9/2010 | McKee et al. | |
| 8,580,648 B2 * | 11/2013 | Choi | H01G 4/33 438/396 |
| 8,897,067 B2 * | 11/2014 | Prabhakar | H01L 29/66833 365/185.08 |
| 2009/0315109 A1 | 12/2009 | Kim | |
| 2013/0148409 A1 | 6/2013 | Chung | |
| 2013/0153960 A1 | 6/2013 | Yang | |
| 2013/0270559 A1 | 10/2013 | Hafez et al. | |
| 2014/0015095 A1 | 1/2014 | Hui et al. | |

FOREIGN PATENT DOCUMENTS

| | | |
|---|---|---|
| KR | 2010041096 | 4/2010 |
| KR | 2011024035 | 3/2011 |

* cited by examiner

*Primary Examiner* — David Nhu
(74) *Attorney, Agent, or Firm* — Onello & Mello, LLP

(57) ABSTRACT

A semiconductor device may include: a substrate. First and second gate electrode patterns are disposed on first and second fin type active patterns. The first and second fin type active patterns include a first channel region disposed between a first impurity region and a second impurity region. The second gate electrode pattern crosses a first gate-separating region included in the second fin type active region. The first gate-separating region includes a trench and an embedded insulator filling at least a portion of the trench.

19 Claims, 30 Drawing Sheets

A - A'

A − A', B − B'

B - B'

C - C'

D - D'

NON-VOLATILE MEMORY WITH IMPROVED SENSING WINDOW

CROSS-REFERENCE TO RELATED APPLICATION

This application claims priority under 35 U.S.C. §119 to Korean Patent Application No. 10-2014-0116373, filed on Sep. 2, 2014, in the Korean Intellectual Property Office, the entire contents of which are hereby incorporated by reference.

FIELD

The present disclosure relates to a semiconductor device and a method of manufacturing the same. Specifically, the present disclosure relates to a non-volatile memory with an improved sensing window.

BACKGROUND

One-time programmable (OTP) non-volatile memory devices, may be programmed by breaking a connection path using a fuse or creating the connection path using an antifuse. If such an OTP device is programmed, it may be infeasible to further modify the contents of the device without the use of an additional device because the programming is irreversible. An OTP device may be a memory device capable of being used for security purposes for example.

SUMMARY

An aspect of the present disclosure may provide a semiconductor device including an antifuse one-time programmable (OTP) memory device having improved functionality.

An aspect of the present disclosure may also provide a method of efficiently manufacturing the semiconductor device.

According to an aspect of the present disclosure, a semiconductor device includes a substrate; at least one first fin active pattern and at least one second fin active pattern, the first and second fin active pattern extended in a first direction on the substrate and including a first impurity region and a second impurity region; a first gate electrode and a second gate electrode on the first fin active pattern and the second fin active pattern; a first contact portion electrically connected to the first impurity region of each of the first fin active pattern and the second fin active pattern; and a second contact portion electrically connecting the second impurity region of the first fin active pattern to the second impurity region of the second fin active pattern, wherein the second fin type active pattern includes a first gate-separating region including a trench and an embedded insulator filling at least a portion of the trench, and the second gate electrode is extended in a second direction different from the first direction to cross the first gate-separating region.

Each of the first fin active pattern and the second fin active pattern may further include a first channel region disposed between the first impurity region and the second impurity region.

The first gate electrode pattern may be extended in the second direction to cross the first active pattern and the second fin active pattern and may be disposed on the first channel of each of the first fin active pattern and the second fin active pattern.

The first fin type active pattern may further include a second channel region, the second impurity region of the first fin active pattern is between the first channel region and the second channel region of the first fin active pattern, and the second impurity region of the second fin active pattern may is between the first channel region and the first gate-separating region of the second fin active pattern.

The second gate electrode pattern may cross the first fin active pattern and the second fin active pattern and is on the second channel region of the first fin active pattern and the first gate-separating region of the second fin active pattern.

The first gate-separating region may have a width greater than that of the second gate electrode pattern.

Each of the first fin active pattern and the second fin active pattern may further include a third impurity region, the second channel region of the first fin active pattern is between the second impurity region and the third impurity region of the first fin active pattern, and the first gate-separating region of the second fin active pattern is between the second impurity region and the third impurity region of the second fin active pattern.

The second fin active pattern may have a first end surface and a second end surface opposing the first end surface in the first direction, and the first gate-separating region of the second fin active pattern may contact one of the first end surface and the second end surface.

The second fin type active pattern may have a first end surface and a second end surface opposing the first end surface in the first direction, and the second gate electrode pattern may cover one of the first end surface and second end surface.

The first gate-separating region may have a width narrower than that of the second gate electrode pattern.

The second impurity region of the second fin active pattern has a first depth from an upper surface of the second fin active pattern, and the trench of the first gate-separating region has a second depth greater than the first depth.

Each of the first fin active pattern and the second fin active pattern may have a first end surface and a second end surface opposing the first end surface in the first direction, and include a plurality of first channel regions and a plurality of second impurity regions, and the first impurity region of the first fin active pattern and the second fin active pattern is arranged in a central portion positioned between the first end surface and the second end surface of each of the first fin active pattern and the second fin active pattern.

The semiconductor device may include a plurality of first gate electrodes and a plurality of second gate electrodes, the plurality of first gate electrodes are on the plurality of respective first channel regions of each of the first fin active pattern and the second fin active pattern, and the plurality of second gate electrodes are adjacent to the respective first end surface or the second end surface of each of the first fin active pattern and the second fin active pattern.

The first gate-separating region may be disposed to be adjacent to the second end surface of the second fin active pattern, and at least one of the first fin active pattern and the second fin active pattern includes a second gate-separating region adjacent to the first end surface and including a trench and an embedded insulator filling at least a portion of the trench.

Each of the first fin active pattern and the second fin active pattern has the first end surface and the second end surface opposing the first end surface in the first direction, and includes the plurality of first channel regions and a plurality of first impurity regions and second impurity regions, each of the first fin active patterns and the second fin active patterns includes a plurality of first contact portions disposed on the plurality of first impurity regions, and each of the first fin active patterns and the second fin active patterns may include a third gate-separating region between the plurality of first impurity regions and including a trench and an embedded insulator filling at least a portion of the trench.

The third gate-separating region of each of the first fin active patterns and the second fin active patterns is arranged in a central portion positioned between the first end surface and the second end surface of each of the first fin active patterns and the second fin active patterns.

A bottom surface of the trench of the first gate-separating region is positioned on a level lower than one surface of the substrate on which the second fin type active pattern is disposed.

The semiconductor device may further include: a device-separating layer disposed on the substrate, wherein a bottom surface of the trench of the first gate-separating region is at a level higher than that of one surface of the device-separating layer adjacent to the substrate, and is at a level lower than that of an opposing surface of the device-separating layer, opposing the one surface thereof.

The semiconductor device may further include: a device-separating layer disposed on the substrate, wherein a bottom surface of the trench of the first gate-separating region is at a level higher than those of one surface of the device-separating layer adjacent to the substrate and an opposing surface of the device-separating layer, opposing the one surface thereof.

The second fin type active pattern may be provided as a plurality of second fin type active patterns.

In the plurality of second fin active patterns, the embedded insulator of the first gate-separating region provided in one second fin active pattern and the embedded insulator of the first gate-separating region provided in another second fin active pattern may be integrally formed.

In the plurality of second fin active patterns, the embedded insulator of the first gate-separating region provided in one second fin active pattern may be extended in the second direction and fill at least a portion of the trench of the first gate-separating region provided in another second fin active pattern.

The number of the second fin active patterns may be greater than that of the first fin active patterns.

A length of the first fin active pattern is substantially equal to a length of the second fin active pattern.

The first fin active pattern and the second fin active pattern are arranged in the second direction.

The semiconductor device may further include: a device-separating layer on the substrate, wherein the first fin active pattern and the second fin active pattern are defined by the device-separating layer.

A read voltage is applied to the first gate electrode pattern and a write voltage is applied to the second gate electrode pattern.

According to another aspect of the present disclosure, a semiconductor device may include: a substrate; at least one first active pattern and at least one second active pattern, the first active pattern and the second active pattern extended in a first direction on the substrate and including a first impurity region and a second impurity region; and a first gate electrode and a second gate electrode on the first active pattern and the second active pattern, wherein the second active pattern has a first gate-separating region, an electrical insulation region, and the second gate electrode pattern is extended in a second direction different from the first direction to cross the first gate-separating region.

According to another aspect of the present disclosure, a method of manufacturing a semiconductor device may include: forming at least one first active pattern and at least one second active pattern on the substrate, the first active pattern and the second active pattern extended in a first direction; forming a gate-separating region on the second active pattern; forming a first gate electrode pattern on the first active pattern and the second active pattern, the first gate electrode extended in a second direction different from the first direction and crossing the first active pattern and the second active pattern; forming a second gate electrode on the first active pattern and the second active pattern, the second gate electrode being extended in the second direction and crossing the gate-separating region on the second active pattern and the first active pattern; and Raining an impurity region on exposed portions of the first active pattern and the second active pattern exposed between the first gate electrode and the second gate electrode, wherein the forming of the gate-separating region may include forming a trench in the second active pattern and forming an embedded insulator filling at least a portion of the trench.

In the forming of the impurity region, a depth of the impurity region may be formed to be smaller than a depth of the trench of the gate-separating region.

In the forming of the trench, the trench may be formed such that a bottom surface of the trench is at a level lower than that of one surface of the substrate on which the second active pattern is disposed.

The method may further include: forming a device-separating layer defining the first active pattern and the second active pattern on the substrate.

In forming the trench, a bottom surface of the trench is at a level higher than that of one surface of the device-separating layer adjacent to the substrate, and is at a level lower than that of an opposing surface of the device-separating layer, opposing the one surface thereof.

In the forming of the trench, a bottom surface of the trench is at a level higher than one surface of the device-separating layer adjacent to the substrate and an opposing surface of the device-separating layer, opposing the one surface thereof.

The gate-separating region may have a width greater than that of the second gate electrode.

A length of the first active pattern is substantially equal to a length of the second active pattern.

The second active pattern is provided as a plurality of second active patterns.

The method may further include: forming a first contact electrically connected to respective first impurity regions of the first active pattern and the second active pattern.

The method may further include: forming a second contact electrically connecting a second impurity region of the first active pattern to a second impurity region of the second active pattern.

The first active pattern is a first fin active pattern and the second active is a second fin active pattern.

According to another aspect of the present disclosure, a non-volatile memory comprises a plurality of access transistors, each having a first common gate, a first common source connected to a bit line and a first common drain. Each of a plurality of programmable transistors have a second common gate and a second common source connected to the first common drain. At least one, and less than all, of the programmable transistors are configured to form a resistive short between the second common gate and the second common source upon application of a high voltage to the second common gate. A first number of the plurality of programmable transistors is equal to a second number of the plurality of access transistors.

At least one, and less than all, of the programmable transistors includes a respective gate separation region configured to prevent a formation of the resistive short between the respective second common gate and the second common source.

At least one of the respective gate separation regions includes a trench filled at least partially with an insulator.

At least two of the respective gate separation regions include a shared trench filled at least partially with an insulator.

Each of the access transistors and each of the programmable transistors have substantially a same gate area.

However, advantages and effects according to example embodiments of the present disclosure are not limited to the description as described above, and other technical effects not mentioned yet could be easily understood to a person having ordinary skill in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
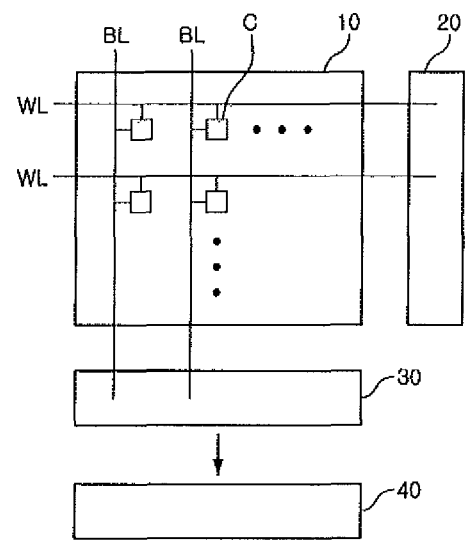
FIG. 1 is a block diagram of a memory device including a semiconductor device according to an example embodiment of the present disclosure.

Example embodiments of the present disclosure will now be described in detail with reference to the accompanying drawings.

The disclosure may, however, be described in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2A:
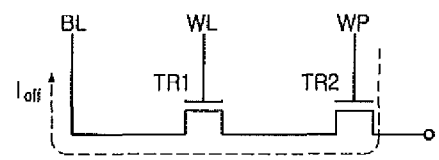
FIG. 2A and FIG. 2B are circuit diagrams illustrating operation of an antifuse memory cell.
Figure 2B:
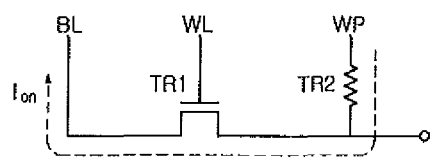

Referring to FIG. 1, FIG. 2A and FIG. 2B, a memory device may include a semiconductor device including a memory cell array 10, a row decoder 20, a column decoder 30 and a sense amplifier 40.

The memory cell array 10 may include a plurality of antifuse memory cells C respectively positioned between at least one bit line BL and at least one word line WL. Each of the antifuse memory cells C may be connected to a respective bit line BL and respective word line WL.

The row decoder 20 may select the word line WL on the basis of a row in which a target cell to be accessed is positioned within the memory cell array 10, (e.g. a decoded word line WL address). The column decoder 30 may select the bit line BL on the basis of a column in which a target cell to be accessed is positioned within the memory cell array 10, (e.g. a decoded bit line BL address). The sense amplifier 40 may be connected to one end of the at least one bit line BL and may sense and amplify data of the target cell to thereby output the amplified data.

Referring to FIG. 2A and FIG. 2B, the antifuse memory cell C may include a plurality of transistors TR1 and TR2. For example, two transistors TR1 and TR2 may function as a single bit. One of the two transistors TR1 and TR2 may be provided for a writing operation and the other may be provided for a reading operation. More specifically, the first transistor TR1, used for the reading operation, may have a gate terminal connected to the word line WL, a drain terminal connected to the bit line BL, and a source terminal connected to a drain terminal of the second transistor TR2. TR2 is used for the writing operation. The second transistor TR2 may have a gate terminal connected to a high voltage line WP and a source terminal connected to a floating terminal.

A difference in operations in a state in which the antifuse memory cell C is not programmed and in a state in which the antifuse memory cell C is programmed will be described with reference to FIG. 2A and FIG. 2B.

FIG. 2A illustrates a state in which the antifuse memory cell C is not programmed. The operation in this unprogrammed state will now be described. First, when power is applied to the high voltage line WP, a leakage current is generated through a gate insulating layer of the second transistor TR2. In this case, when voltage is applied from the word line WL to the gate terminal of the first transistor TR1 in order to perform the reading operation, the leakage current (hereinafter, referred to as an off-current (Ioff) may flow in the bit line BL.

FIG. 2B illustrates a state in which the antifuse memory cell C of the semiconductor device is programmed.

The bit line BL and a substrate provided with the first and second transistors TR1 and TR2 may be connected to a ground, a turn-on voltage (Vturn-on) may be applied to the gate WL of the first transistor TR1 and a high voltage (Vhigh) having a voltage level higher than that of the turn-on voltage may be applied to the gate WP of the second transistor TR2. For example, a voltage of approximately 2V may be applied to the first transistor TR1 and a voltage of approximately 5V may be applied to the second transistor TR2. In this case, an insulation breakdown may occur in the insulating layer between a gate electrode and an active pattern of the second transistor TR2, and thus, the gate oxide of the second transistor TR2 may be changed to a resistor.

In a case where the antifuse memory cell C is programmed, an ON-current (Ion) may flow from Wp through TR1 and into the bit line BL. The antifuse memory cell C may be sensed as having been programmed using a difference between a current value of Ioff and Ion. The difference between the Ioff and Ion currents may also be referred to as a sense window. In one embodiment a reference level established substantially at a mid-point between Ioff and Ion is used to sense the Off or On states respectively of the non-volatile memory.

Referring to FIG. 3A, FIG. 3B and FIG. 4A through FIG. 4D, the semiconductor device 1 according to an example embodiment may include a substrate 100, at least one first fin type active pattern 120a and at least one second fin type active pattern 120b, first and second gate electrode patterns 131 and 132 respectively, and first and second contact portions 141 and 142 respectively.

As described herein, the use of the fin type active pattern is a scheme for implementing a fine element, but the present disclosure is not limited thereto. Thus, another active pattern rather than the fin type active pattern may be used. For example, first and second active patterns may be implemented.

The substrate 100 may be formed of bulk silicon or a silicon-on-insulator (SOT), but is not limited thereto. The substrate 100 may be a silicon substrate. Other materials for forming the substrate 100 may include, for example, silicon germanium, indium antimonide, lead telluride compounds, indium arsenide, indium phosphide, gallium arsenide, and gallium antimonide. In addition, the substrate 100 may include a base substrate and an epitaxial layer formed on the base substrate.

In an example embodiment, a device-separating layer 110 may be disposed on the substrate 100. The first and second fin type active patterns 120a and 120b may be defined by the device-separating layer 110 and be electrically insulated from each other. The device-separating layer 110 may contain an insulating material, for example, a nitride or oxynitride.

The first and second fin type active patterns 120a and 120b may be disposed on the substrate 100. Each of the first and second fin type active patterns 120a and 120b may protrude in a third direction (Z) from the substrate 100 and be extended in a first direction (X). More particularly, the first and second fin type active patterns 120a and 120b may be extended from first end surfaces 1a and 1b to second end surfaces 2a and 2b thereof, respectively, in the first direction (X). The first and second fin type active patterns 120a and 120b may be arranged to be spaced apart from each other in a second direction (Y) orthogonal to the first direction (X). The present disclosure is not limited thereto, but the first and second fin type active patterns 120a and 120b may have substantially the same length extended in the first direction (X).

In the example embodiment, at least one first fin type active pattern 120a and at least one second fin type active pattern 120b may be provided. Thus, a single first fin type active pattern 120a and a single second fin type active pattern 120b may be provided as illustrated in the example embodiment, but a plurality of first fin type active patterns 120a and a plurality of second fin type active patterns 120b may be provided. In addition, a single first fin type active pattern 120a and a plurality of second fin type active patterns 120b may be provided or a plurality of first fin type active patterns 120a and a single second fin type active pattern 120b may be provided. For example, the number of the second fin type active patterns 120b may be greater than that of the first fin type active patterns 120a.

The first and second fin type active patterns 120a and 120b respectively, may contain a semiconductor material, silicon and/or germanium, and may also contain a compound semiconductor material, for example, a group IV-IV compound semiconductor material or a group III-V compound semiconductor material.

The first and second fin type active patterns 120a and 120b may be formed by etching portions of the substrate 100 but are not limited thereto. The first and second fin type active patterns 120a and 120b may be formed by performing a selective epitaxial growth (SEG) process on the substrate 100.

The first and second fin type active patterns 120a and 120b respectively may include first impurity regions 11a and 11b and the second impurity regions 12a and 12b, and first channel regions 21a and 21b disposed between the first and second impurity regions. In the case where the first gate electrode pattern 131 is a gate terminal of a PMOS transistor, the first impurity regions 11a and 11b and the second impurity regions 12a and 12b may contain a p-type impurity. In the case that the first gate electrode pattern 131 is a gate terminal of an NMOS transistor, the first impurity regions 11a and 11b and the second impurity regions 12a and 12b may contain an n-type impurity. The first impurity regions 11a and 11b and the second impurity regions 12a and 12b may serve as a source/drain region of a transistor.

Further, the first fin type active pattern 120a may further include a second channel region 22a. The second impurity region 12a may be disposed between the first and second channel regions 21a and 22a respectively of the first fin type active pattern 120a. In this case, the first fin type active pattern 120a may be extended from the first end surface 1a to the second end surface 2a thereof in the first direction (X), and include the first impurity region 11a, the first channel region 21a, the second impurity region 12a, and the second channel region 22a that are sequentially positioned in the first direction (X).

The second fin type active pattern 120b may further include a first gate-separating region 31. The first gate-separating region 31 may include a trench t formed in the second fin type active pattern 120b and an embedded insulator S filling at least a portion of the trench t.

The trench t of the first gate-separating region 31 is further described with reference to FIG. 4B and FIG. 4D. The trench t may be formed by, for example, applying a shallow trench isolation (STI) process to the second fin type active pattern 120b.

A depth of the second impurity region 12b from an upper surface of the second fin type active pattern 120b is indicated by a first depth d1. A depth of the trench t is determined in a range equal between the first depth d1 and the second depth d2. Although FIG. 4B and FIG. 4D illustrates a case in which a bottom surface S4 of the trench t may be positioned on a level higher than that of one surface S2 of the device-separating layer 110 adjacent to the substrate 100, and be positioned on a level lower than that of an opposing surface S3 of the device-separating layer 110, opposing the one surface S2 thereof, the present disclosure is not limited thereto. The depth of the trench t may be increased to a degree such that the bottom surface 84 may be positioned on a level lower than that of one surface S1 of the substrate 100 on which the second fin type active pattern 120b is disposed. Conversely, the depth of the trench t may be decreased to a degree such that the bottom surface S4 may be positioned on a level higher than that of the opposing surface S3 of the device-separating layer 110. However, the depth of the trench t is not limited thereto. The depth d2 of the trench t may also be substantially identical to or less than the first depth d1.

The embedded insulator S may fill at least a portion of the trench t. The embedded insulator S may contain an insulating material, for example, an oxide, a nitride and/or an oxynitride. An upper surface of the embedded insulator S may be positioned on a level substantially the same as that of the upper surface of the second fin type active pattern 120b, but is not limited thereto. Thus, the upper surface of the embedded insulator S may protrude from the upper surface of the second fin type active pattern 120b while being positioned on a level higher than that of the upper surface of the second fin type active pattern 120b. Conversely, the upper surface of the embedded insulator S may be positioned on a level lower than that of the upper surface of the second fin type active pattern 120b.

Figure 3A:
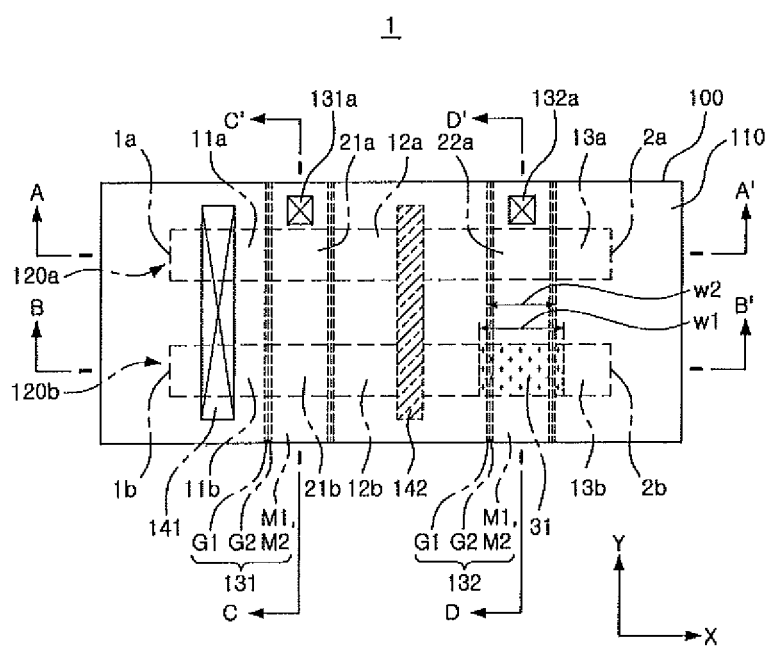
FIG. 3A is a plan view of a semiconductor device according to an example embodiment of the present disclosure.
Figure 4A:
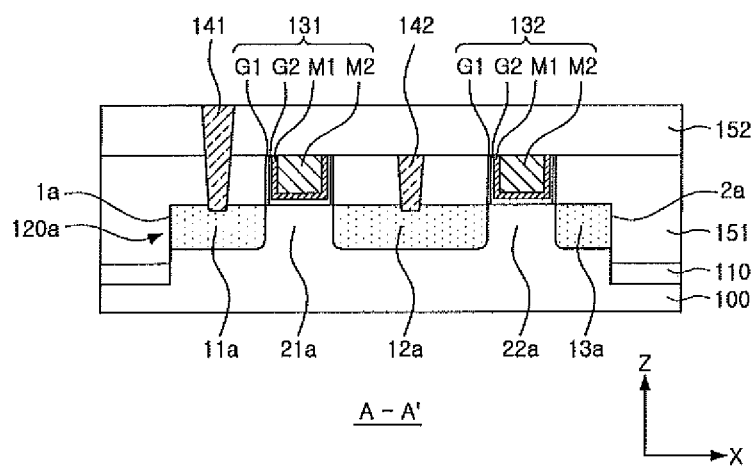
FIG. 4A through FIG. 4D are cross-sectional views of the semiconductor device illustrated in FIG. 3A, taken along line A-A', line B-B', line C-C', and line D-D', respectively.
Figure 4B:
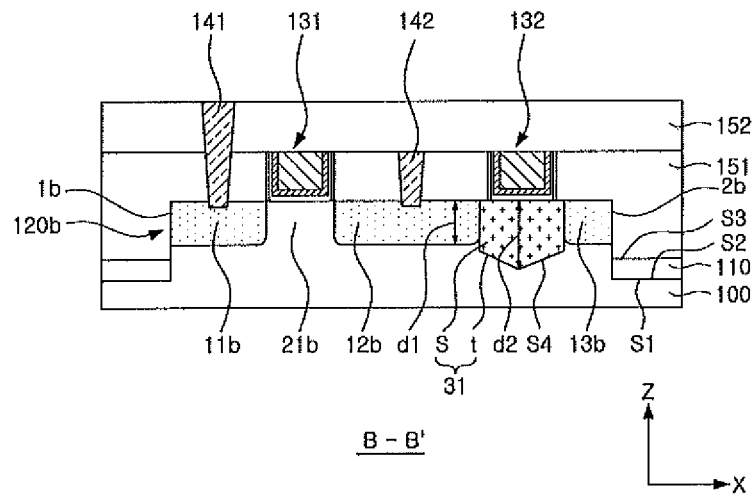

Referring to FIG. 3A and FIG. 4B, the second impurity region 12b of the second fin type active pattern 120b may be disposed between the first channel region 21b and the first gate-separating region 31 of the second fin type active pattern 120b. In this case, the second fin type active pattern 120b may be extended from the first end surface 1b to the second end surface 2b thereof in the first direction (X), and may include the first impurity region 11b, the first channel region 21b, the second impurity region 12b and the first gate-separating region 31 that are sequentially positioned in the first direction (X).

With reference to FIG. 3A, the first and second fin type active patterns 120a and 120b, the first impurity regions 11a and 11b, the first channel regions 21a and 21b, and the second impurity regions 12a and 12b may be disposed in positions corresponding to each other. In addition, the second channel region 22a of the first fin type active pattern 120a may be disposed in a position corresponding to the first gate-separating region 31 of the second fin type active pattern 120b. Here, because the term "being disposed in positions corresponding to each other" means facing each other, it does not mean that corresponding portions necessarily have the same length or dimensions.

The first and second fin type active patterns 120a and 120b may further include third impurity regions 13a and 13b, respectively. As illustrated in FIG. 3A, FIG. 4A, and FIG. 4B, the second channel region 22a of the first fin type active pattern 120a may be disposed between the second and third impurity regions 12a and 13a of the first fin type active pattern 120a. The first gate-separating region 31 of the second fin type active pattern 120b may be disposed between the second and third impurity regions 12b and 13b of the second fin type active pattern 120b. The third impurity regions 13a and 13b may contain a p-type impurity or an n-type impurity as the second gate electrode pattern 132 is employed as a gate terminal of a PMOS or NMOS transistor respectively, but are not limited thereto.

The first and second gate electrode patterns 131 and 132 may be disposed on the first and second fin type active patterns 120a and 120b. Specifically, each of the first and second gate electrode patterns 131 and 132 may be extended in the second direction (Y) and be disposed to cross the first and second fin type active patterns 120a and 120b.

Figure 4C:
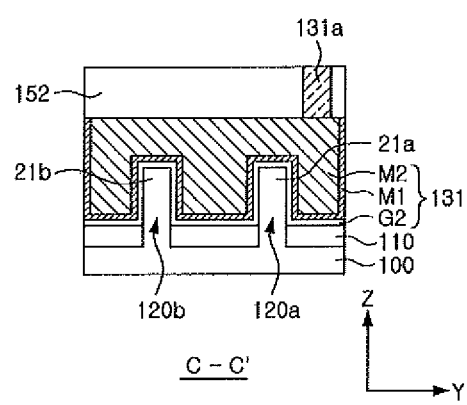
Figure 4D:
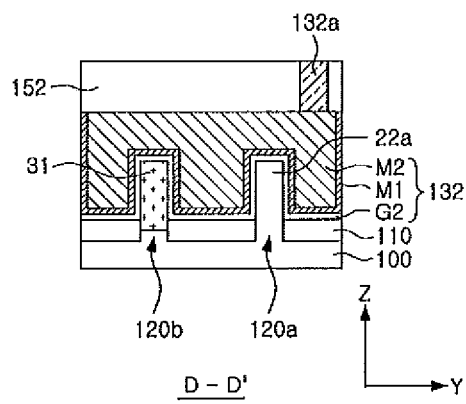

Each of the first and second gate electrode patterns 131 and 132 may include a first metal layer M1, a second metal layer M2, and a gate insulating layer G2 as shown in FIG. 4C and FIG. 4D, but is not limited thereto.

For example, the first metal layer M1 of each of the first and second gate electrode patterns 131 and 132 may adjust a work function and the second metal layer M2 thereof may serve to fill a space formed by the first metal layer M1. For example, the first metal layer M1 may contain at least one of TiN, TaN, TiC, and TaC. The second metal layer M2 may contain W or Al.

The first and second gate electrode patterns 131 and 132 may be formed of Si, SiGe or the like, rather than being formed of a metal. Such an electrode pattern may be formed by performing, after forming a sacrificial layer, a replacement process in which the sacrificial layer is replaced by a metal layer, but the present disclosure is not limited thereto.

The gate insulating layer G2 of each of the first and second gate electrode patterns 131 and 132 may cover a lower surface and side surfaces of the first metal layer M1, and may contain a silicon oxide, a silicon nitride, a silicon oxynitride or a high-k material. The high-k material may include at least one from among hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

A gate spacer G1 may be disposed at a side surface of the gate insulating layer G2 of each of the first and second gate electrode patterns 131 and 132. The gate spacer G1 may contain at least one of silicon nitride (SiN), silicon oxynitride (SiON), silicon oxide ($SiO_2$), silicon oxycarbide nitride (SiOCN) and combinations thereof. The gate spacer G1 may be implemented as a single layer but may also be realized with multiple layers.

The first gate electrode pattern 131 may be disposed on the first channel regions 21a and 21b of the respective first and second fin type active patterns 120a and 120b. Accordingly, the first gate electrode pattern 131 may serve as the gate electrode of the first transistor TR1 for the reading operation, among two transistors described in FIG. 2A. Thus, a read voltage may be applied to the first gate electrode pattern 131 via a first gate plug 131a connected to the word line WL.

The second gate electrode pattern 132 may be disposed on the second channel region 22a of the first fin type active pattern 120a and on the first gate-separating region 31 of the second fin type active pattern 120b. A width w1 of the first gate-separating region 31 may be greater than a width w2 of the second gate electrode pattern 132, and accordingly, the second gate electrode pattern 132 may be understood as crossing over the first gate-separating region 31 in the second direction (Y).

The second gate electrode pattern 132 may serve as the gate electrode of the second transistor TR2 for the writing operation, amongst the two transistors described in FIG. 2A. Thus, a write voltage may be applied to the second gate electrode pattern 132 via a second gate plug 132a connected to the high voltage line WP.

Figure 13A:
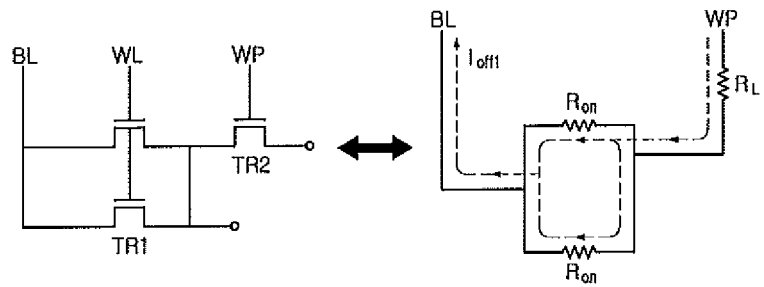
FIG. 13A and FIG. 13B are circuit diagrams of an antifuse memory cell in accordance with the semiconductor device described in the foregoing embodiments.
Figure 13B:
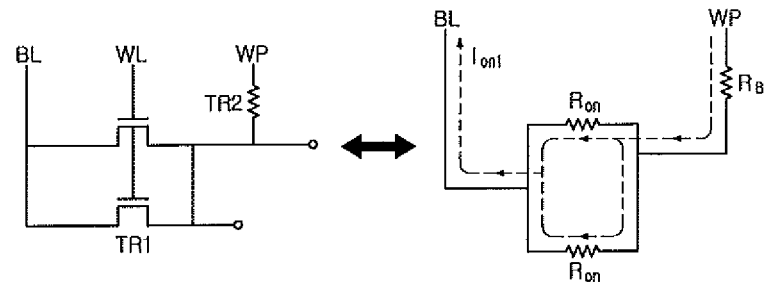

The first gate electrode pattern 131 may be disposed on the first channel regions 21a and 21b of the first and second fin type active patterns 120a and 120b respectively. The first gate electrode pattern 131 may serve as the gate electrodes of the two first transistors TR1 as illustrated in FIG. 13A and FIG. 13B. The second gate electrode pattern 132 may be disposed on the second channel region 22a of the first fin type active pattern 120a. Accordingly, it may serve as the gate electrode of the second transistor TR2 on the first fin type active pattern 120a; however, the second gate electrode pattern 132 may be disposed to cross the first gate-separating region 31 of the second fin type active pattern 120b and accordingly, it may not serve as the gate electrode of the second transistor TR2 on the second fin type active pattern 120b. In effect, the first gate-separating region 31 may be an electrical insulating region. In this case, as illustrated in FIG. 13A and FIG. 13B, the second gate electrode pattern 132 may serve as a gate electrode of a single second transistor TR2.

Consequently, the number of first transistors TR1 for a reading operation may be different from that of the second transistors TR2 for a writing operation, whereby a ratio of Ion to Ioff, (a characteristic of an antifuse OTP memory device), may be increased to thereby allow for improvements in reading operation characteristics. This principle will be further described with reference to FIG. 13A through FIG. 13D, and other configurations of the semiconductor device 1 will be described in more detail.

The first contact portion 141 may be electrically connected to the first impurity regions 11a and 11b of the first and second fin type active patterns 120a and 120b. Although a case in which the first contact portion 141 is disposed on the first impurity regions 11a and 11b of the first and second fin type active patterns 120a and 120b while penetrating through first and second interlayer insulating layers 151 and 152 is illustrated, the present disclosure is not limited thereto.

The first contact portion 141 may penetrate through the first and second interlayer insulating layers 151 and 152 to be exposed outwardly and may serve as a contact plug to thereby be connected to a bit line BL. That is, the first contact portion 141 may function as a drain terminal of the first transistor TR1 in the circuit diagrams illustrated in FIG. 13A and FIG. 13B.

The second contact portion 142 may electrically connect the second impurity region 12a of the first fin type active pattern 120a and the second impurity region 12b of the second fin type active pattern 120b to each other. The second contact portion 142 may not be electrically connected to an external element or source, may be formed within the second interlayer insulating layer 152, for example, and may electrically connect the second impurity regions 12a and 12b of the first and second fin type active patterns 120a and 120b to each other, but the present disclosure is not limited thereto. In the circuit diagrams illustrated in FIG. 13A and FIG. 13B, the second contact portion 142 may serve to connect source terminals of two first transistors TR1 to each other. The first and second contact portions 141 and 142 may contain, for example, Al, Cu, W and the like, but are not limited thereto.

The semiconductor device 1 may include the first interlayer insulating layer 151 disposed above the substrate 100 and the second interlayer insulating layer 152 disposed on the first interlayer insulating layer 151.

The first interlayer insulating layer 151 may cover the first and second fin type active patterns 120a and 120b and the device-separating layer 110. The first interlayer insulating layer 151 may cover portions of side surfaces of the first and second gate electrode patterns 131 and 132 and the first and second contact portions 141 and 142. The second interlayer insulating layer 152 may be disposed on the first interlayer insulating layer 151 and cover upper surfaces of the first and second gate electrode patterns 131 and 132 and the second contact portion 142.

The first and second interlayer insulating layers 151 and 152 may contain, for example, a low dielectric constant material, an oxide, a nitride, and/or an oxynitride, but are not limited thereto. Examples of the low dielectric constant material may include flowable oxide (FOX), tonen silaZen (TOSZ), undoped silica glass (USG), borosilica glass (BSG), phosphosilica glass (PSO), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD), and combinations thereof.

Hereinafter, a method of manufacturing the semiconductor device 1 according to the foregoing example embodiment will be described with reference to FIG. 5A through FIG. 9E.

Figure 3B:
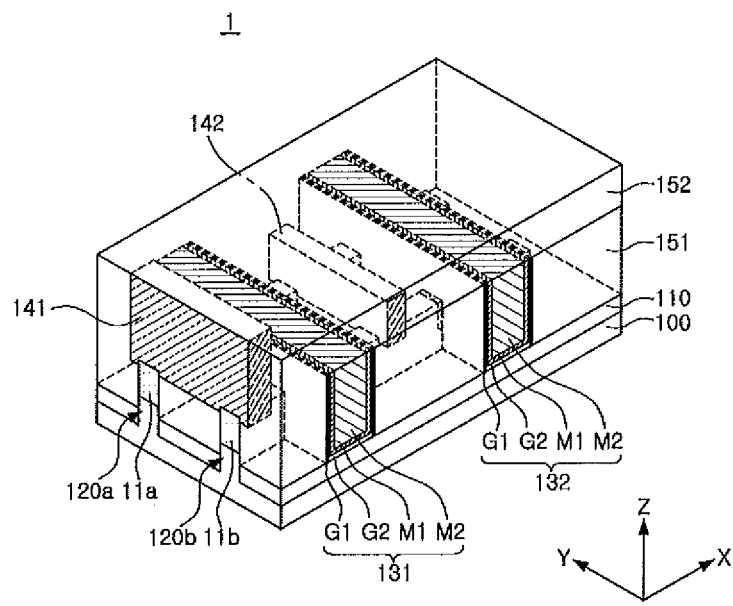
FIG. 3B is a perspective view of a semiconductor device according to an example embodiment of the present disclosure.

FIG. 5A through FIG. 9E are process views illustrating the method of manufacturing the semiconductor device 1 according to the example embodiment illustrated in FIG. 3A and FIG. 3B.

Figure 5A:
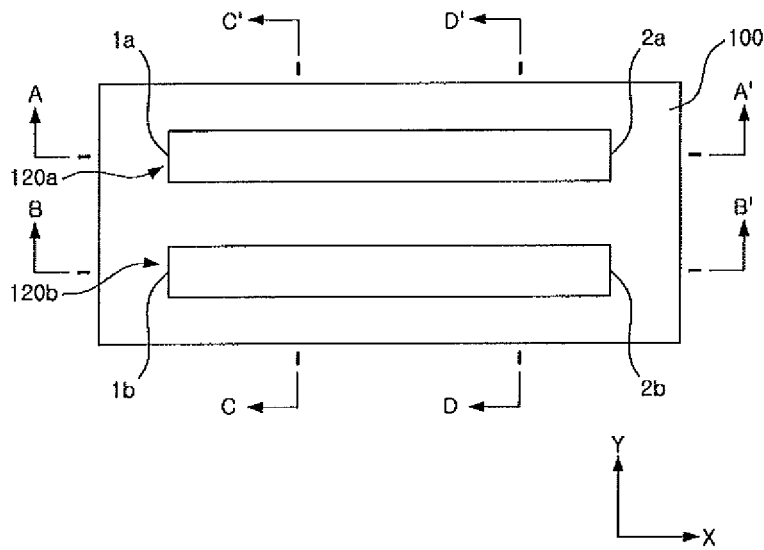
FIG. 5A through FIG. 9E are process views illustrating a method of manufacturing the semiconductor device according to the example embodiment of the present disclosure illustrated in FIG. 3A and FIG. 3B.
Figure 5B:
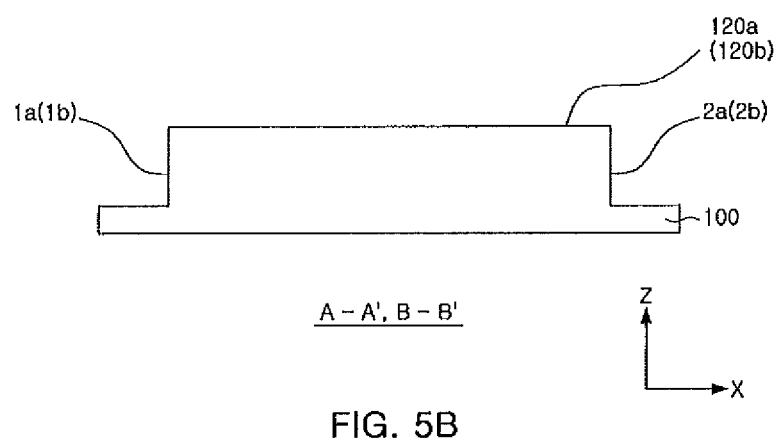
Figure 5C:
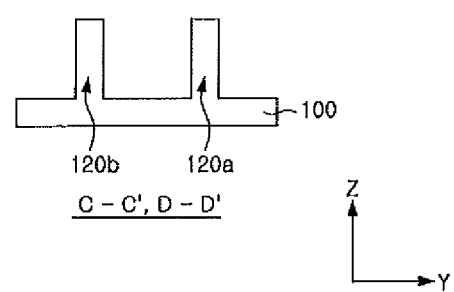

FIG. 5A is a plan view for explaining the method of manufacturing the semiconductor device 1. FIG. 5B is a cross-sectional view, taken along line A-A' or line B-B' of FIG. 5A. FIG. 5C is a cross-sectional view, taken along line C-C' or line D-D' of FIG. 5A.

FIG. 6A through FIG. 9E are illustrated in a similar manner to FIG. 5A through FIG. 5C. Specifically, FIG. 6A, FIG. 7A, FIG. 8A and FIG. 9A are plan views for respective processes of the semiconductor device 1. The remaining FIG. 6B through FIG. 9E illustrate cross-sections of the respective plan views. The cross-sections illustrated in respective cross-sectional views may be easily understood from reference numerals illustrated in the figures.

First, referring to FIG. 5A to FIG. 5C, the manufacturing method may include forming at least one first fin type active pattern 120a and at least one second fin type active pattern 120b on the substrate 100.

The first and second fin type active patterns 120a and 120b may be extended from the first end surfaces 1a and 1b to the second end surfaces 2a and 2b respectively, in the first direction (X) and may protrude in the third direction (Z) from the substrate 100. The first and second fin type active patterns 120a and 120b may be spaced apart from each other in the second direction (Y) different from the first direction (X). The first and second fin type active patterns 120a and 120b may have substantially the same length extended in the first direction (X). A plurality of first fin type active patterns 120a and a plurality of second fin type active patterns 120b may be formed. Alternatively, one of the first and second fin type active patterns 120a and 120b may be singularly provided.

The first and second fin type active patterns 120a and 120b may be formed by etching the substrate 100, but are not limited thereto. The first and second fin type active patterns 120a and 120b may be formed by performing a selective epitaxial growth process on the substrate 100.

Figure 6A:
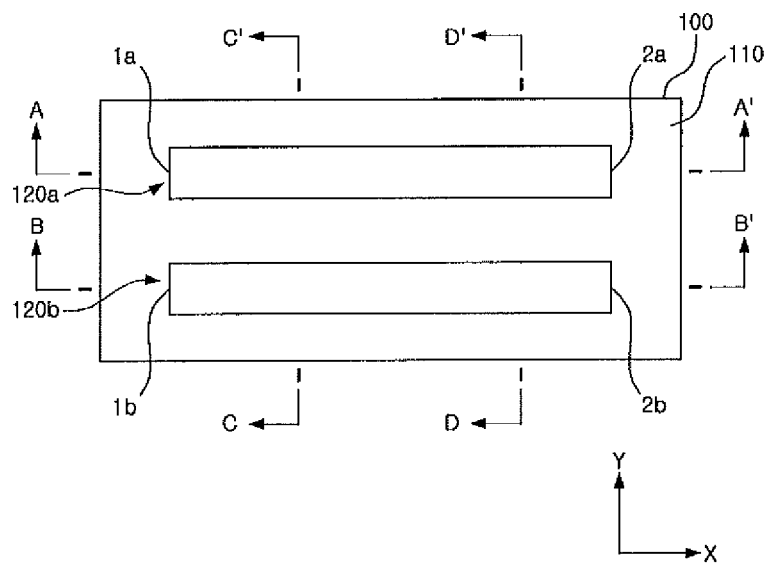
Figure 6B:
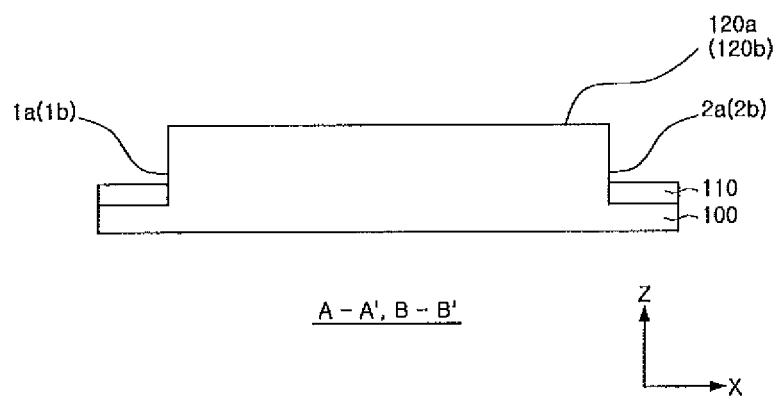
Figure 6C:
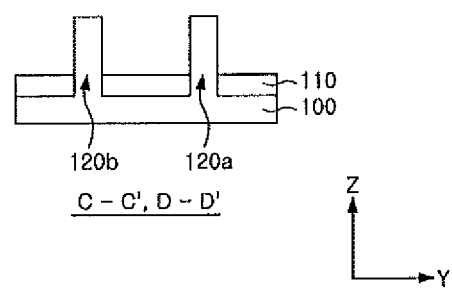

As illustrated in FIG. 6A through FIG. 6C, the device-separating layer 110 may be formed on the substrate 100. The device-separating layer 110 may contain an oxide, a nitride or an oxynitride. The device-separating layer 110 may insulate the first and second fin type active patterns 120a and 120b from each other.

Figure 7A:
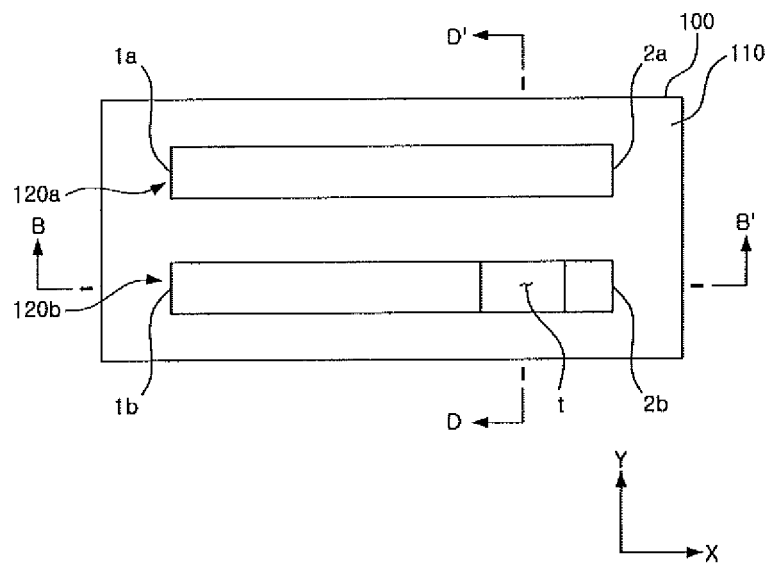
Figure 7B:
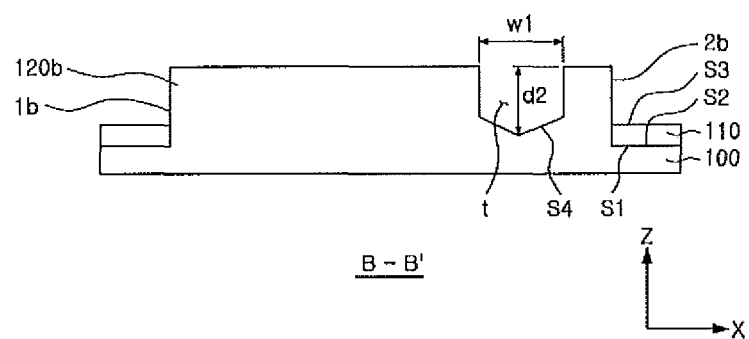

As illustrated in FIG. 7A through FIG. 7B, the trench t may be formed in the second fin type active pattern 120b. The trench t may be formed by, for example, applying a shallow trench isolation (STI) process to the second fin type active pattern 120b. The trench t may be formed to be adjacent to the first or second end surface 1b or 2b of the second fin type active pattern 120b. For example, as illustrated in the example embodiment, the trench t may be adjacent to the second end surface 2b of the second fin type active pattern 120b.

The trench t may have a great depth such that the bottom surface S4 thereof may be positioned on a level lower than that of one surface S1 of the substrate 100 on which the second fin type active pattern 120b is disposed. Conversely, the trench t may have a small depth such that the bottom surface S4 thereof may be positioned on a level higher than those of one surface S2 of the device-separating layer 110 adjacent to the substrate 100 and the opposing surface S3 of the device-separating layer 110, opposing the one surface S2 thereof. In addition, as illustrated in FIG. 7A through FIG. 7C, the bottom surface S4 of the trench t may be positioned on a level higher than that of one surface S2 of the device-separating layer 110 but may be positioned on a level lower than that of the opposing surface S3 of the device-separating layer 110, opposing the one surface S2 thereof.

Figure 8A:
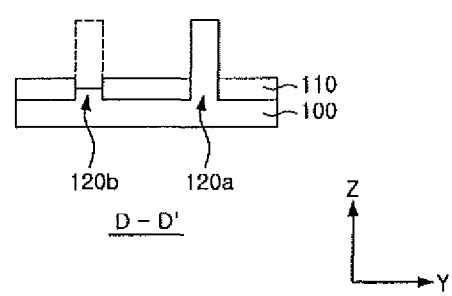
Figure 8B:
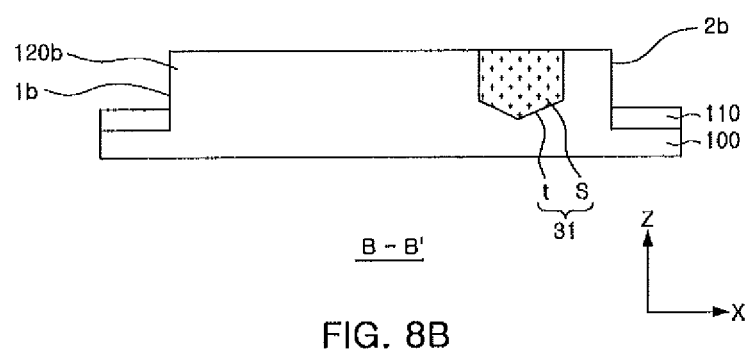
Figure 8C:
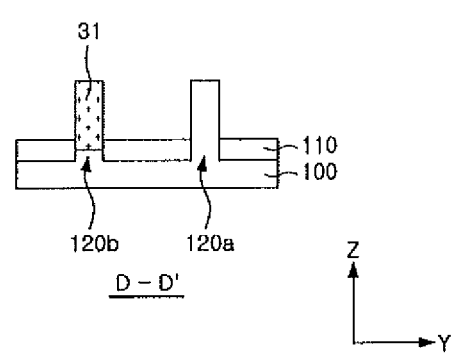
Figure 9A:
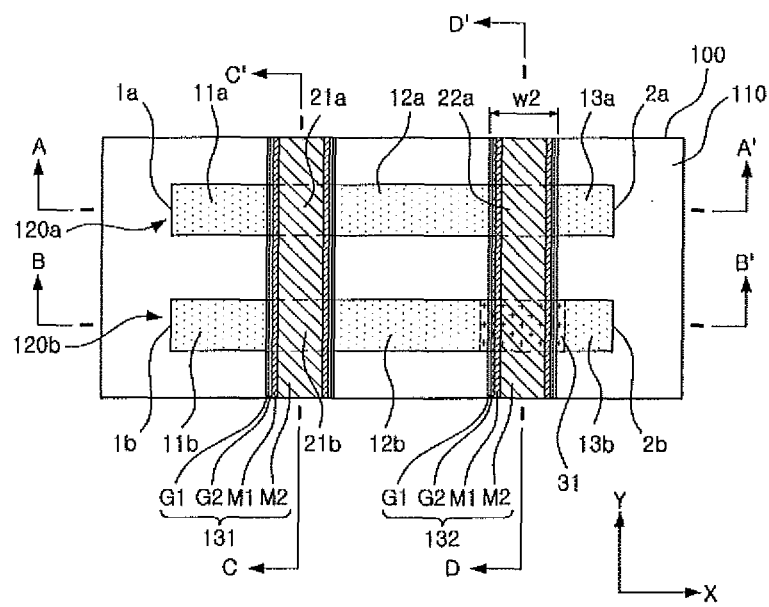
Figure 9B:
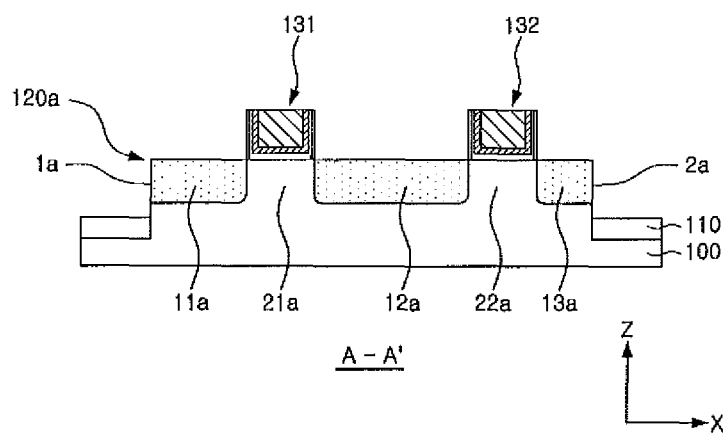
Figure 9C:
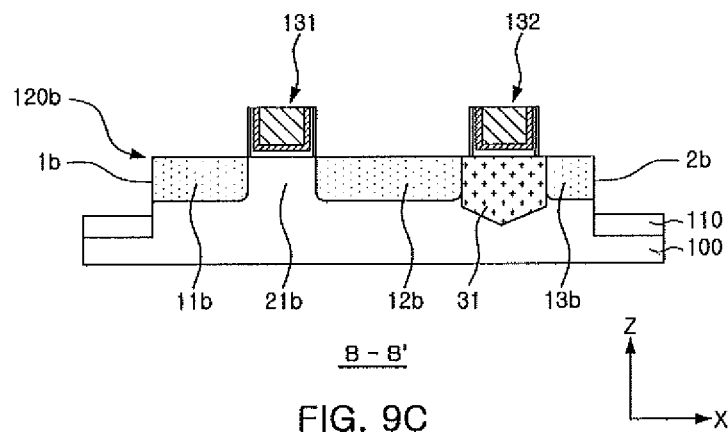
Figure 9D:
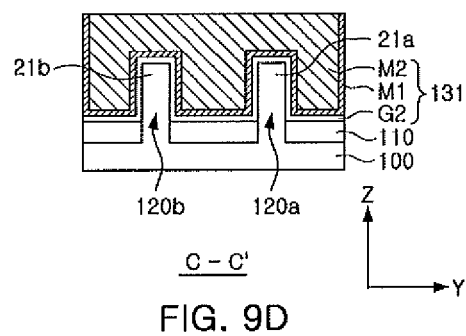
Figure 9E:
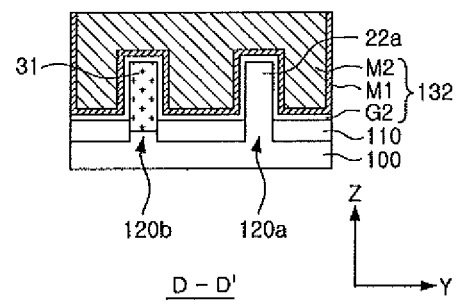

As illustrated in FIG. 8A through FIG. 8C, the embedded insulator S may be formed in the trench t. From the formation, it may be understood that the first gate-separating region 31 is formed on the second fin type active pattern 120b.

The embedded insulator S may fill at least a portion of the trench t and contain an insulating material. The present disclosure is not limited to, but in the formation of the embedded insulator S, a mask pattern used in a process of forming the trench t in the second fin type active pattern 120b may be utilized for forming the embedded insulator S.

As illustrated in FIG. 9A through FIG. 9E, the first and second gate electrode patterns 131 and 132 may be formed on the first and second fin type active patterns 120a and 120b. The first gate electrode pattern 131 may be formed to be extended in the second direction (Y) orthogonal to the first direction (X) and cross over the first and second fin type active patterns 120a and 120b. The second gate electrode pattern 132 may be extended in the second direction (Y) and may cross the first fin type active pattern 120a while crossing the first gate-separating region 31 of the second fin type active pattern 120b. The width w2 of the second gate electrode pattern 132 may be present in an appropriate range in which the width w2 is narrower than the width w1 of the first gate-separating region 31.

Thereafter, the impurity regions 11a, 11b, 12a, 12b, 13a and 13b may be formed in exposed portions of the first and second fin type active patterns 120a and 120b exposed between the first and second gate electrode patterns 131 and 132. In this case, a process of introducing an impurity into the exposed portions of the first and second fin type active patterns 120a and 120b may be included in a process of forming the impurity regions.

However, since the present disclosure is not limited thereto, the process of forming the impurity regions 11a, 11b, 12a, 12b, 13a and 13b may include a process of growing the impurity regions on the exposed portions of the first and second fin type active patterns 120a and 120b exposed between the first and second gate electrode patterns 131 and 132, through a selective epitaxial growth process. In this case, the introduction of the impurity may be performed by an in-situ method or a process of introducing an impurity after growth of the impurity region. Additionally, an ohmic-layer may be formed on the impurity region. The ohmic-layer may contain a metal silicide.

The impurity regions may include the first impurity regions 11a and 11b and the second impurity regions 12a and 12b that are sequentially disposed in the first direction (X). Additionally, the third impurity regions 13a and 13b may be formed. Regions of the first and second fin type active patterns 120a and 120b positioned below the first gate electrode pattern 131 may be defined as the first channel regions 21a and 21b. A region of the first fin type active pattern 120a positioned below the second gate electrode pattern 132 may be defined as the second channel region 22a. Meanwhile, a region of the second fin type active pattern 120b positioned below the second gate electrode pattern 132 may correspond to the first gate-separating region 31. In the process of forming the impurity regions 11a, 11b, 12a, 12b, 13a and 13b, depths of the impurity regions 11a, 11b, 12a, 12b, 13a and 13b may be less than the depth of the trench t formed in the first gate-separating region 31.

Then, the first interlayer insulating layer 151 may be formed on the substrate 100, and a portion of the first interlayer insulating layer 151 may be removed to thereby form the second contact portion 142 electrically connecting the second impurity region 12a of the first fin type active pattern 120a and the second impurity region 12b of the second fin type active pattern 120b to each other.

Thereafter, the second interlayer insulating layer 152 may be formed on the first interlayer insulating layer 151, and the first contact portion 141 may be formed to penetrate through the first and second interlayer insulating layers 151 and 152 and be electrically connected to the respective first impurity regions 11a and 11b of the first and second fin type active patterns 120a and 120b. In addition, by forming the first and second gate plugs 131a and 132a penetrating through the first interlayer insulating layer 151 to be connected to the first and second gate electrode patterns 131 and 132, respectively, the semiconductor device 1 as illustrated in FIG. 3A through FIG. 4D may be obtained.

Figure 10:
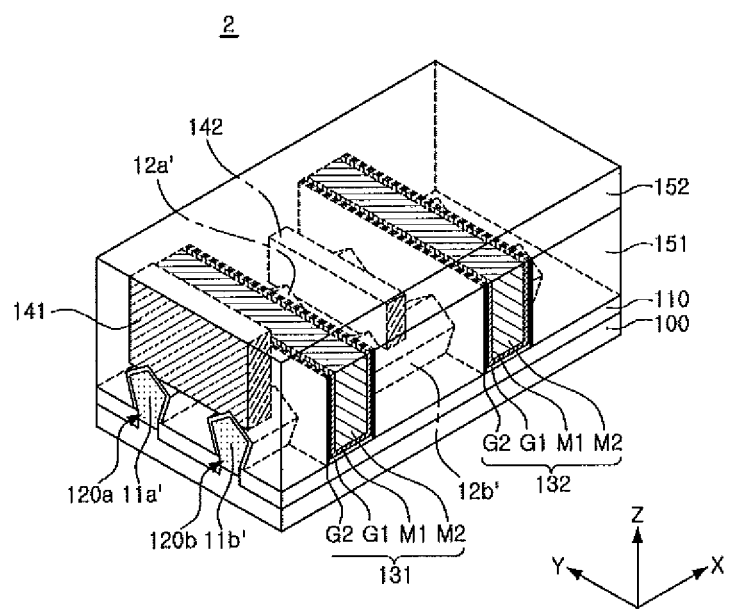
FIG. 10 is a perspective view of a semiconductor device according to another example embodiment of the present disclosure.

FIG. 10 is a perspective view of a semiconductor device 2 according to another embodiment of the present disclosure.

FIG. 10 is provided to illustrate a modified example of the semiconductor device 1 according to the foregoing exemplary embodiment illustrated in FIG. 3B. To avoid redundant description the embodiment of FIG. 10 will be described based on the changes it presents to FIG. 3B.

Referring to FIG. 10, first and second impurity regions 11a', 11b', 12a', and 12b' provided on the respective first and second fin type active patterns 120a and 120b may be formed by a selective epitaxial growth process. Outer circumferential surfaces of the first and second impurity regions 11a', 11b', 12a', and 12b' may respectively have polygonal shapes (for example, pentagonal shapes or hexagonal shapes).

In the case where the first and second gate electrode patterns 131 and 132 are gate terminals of NMOS transistors, the first and second impurity regions 11a', 11b', 12a', and 12b' may contain a tensile stress material. The tensile stress material may be, for example, Si or SiC, a lattice constant of which is lower than that of Si, or the like. In the specification, the tensile stress material or a compression stress material may be used as the term indicating a material itself imparting tensility or compression stress to a circumferential layer adjacent to the material.

In addition, in the case where the first and second gate electrode patterns 131 and 132 are gate terminals of PMOS transistors, the first and second impurity regions 11a', 11b', 12a', and 12b' may contain the compression stress material. The compression stress material may be, for example, SiGe, a lattice constant of which is higher than that of Si. Such a compression stress material may increase a mobility degree of carriers in the first channel regions 21a and 21b or the second channel region 22a provided in the first and second fin type active patterns 120a and 120b.

An ohmic-layer may be disposed on the first and second impurity regions 11a', 11b', 12a', and 12b'. The ohmic-layer may contain a metal silicide.

Figure 11A:
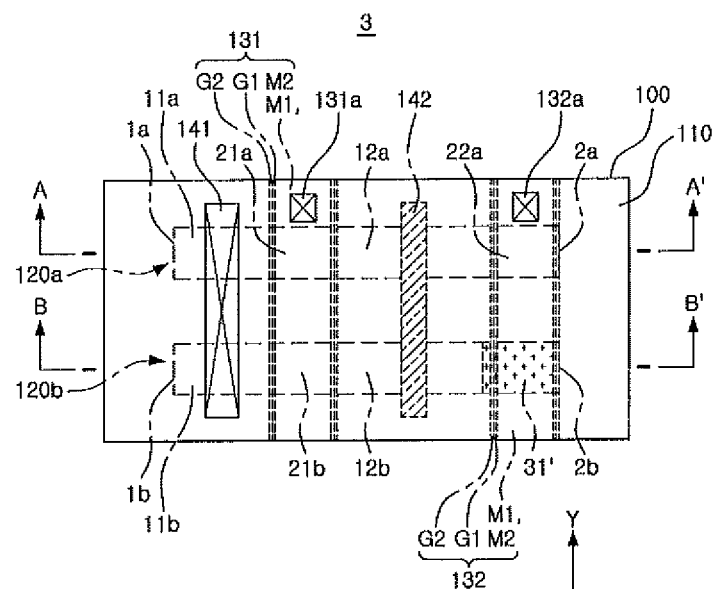
FIG. 11A is a plan view of a semiconductor device according to another example embodiment of the present disclosure.
Figure 11B:
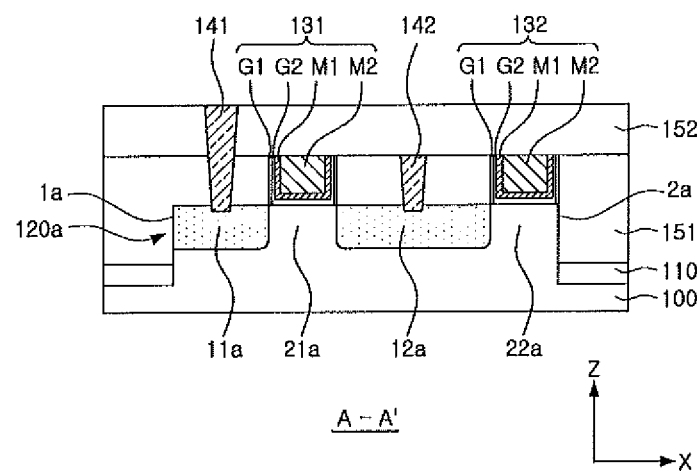
FIG. 11B and FIG. 11C are cross-sectional views of a semiconductor device according to the example embodiment of FIG. 11A.
Figure 11C:
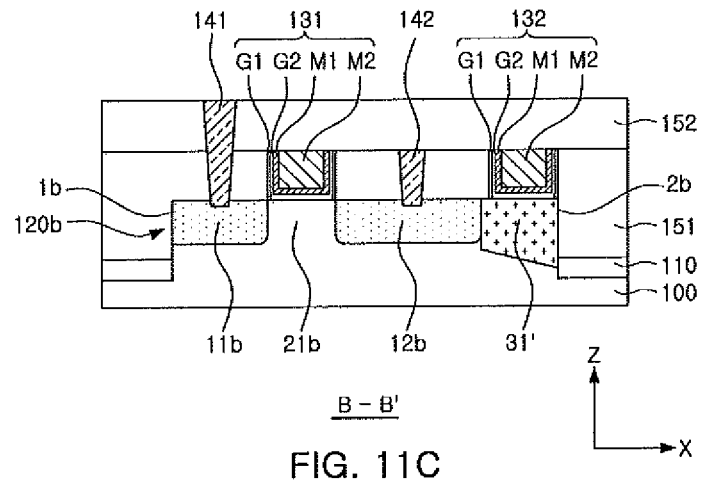

FIG. 11A is a plan view and FIG. 11B through FIG. 11C are cross-sectional views of a semiconductor device 3 according to another example embodiment of the present disclosure. To avoid redundant description the example embodiment of FIG. 11A through FIG. 11C will be described based on the changes it presents to FIG. 3A through FIG. 4D.

Referring to FIG. 11A through FIG. 11C, a first gate-separating region 31' may contact one of the first and second end surfaces 1b and 2b of the second fin type active pattern 120b. For example, as illustrated in the example embodiment, the first gate-separating region 31' may contact the second end surface 2b of the second fin type active pattern 120b.

The second gate electrode pattern 132 may be disposed to cross over edges of the first and second fin type active patterns 120a and 120b. In this case, since the first and second fin type active patterns 120a and 120b do not include the third impurity regions 13a and 13b in the example embodiment as compared to the foregoing example embodiment of FIG. 3A, they may be further advantageous in terms of the miniaturization of the semiconductor device.

Figure 12A:
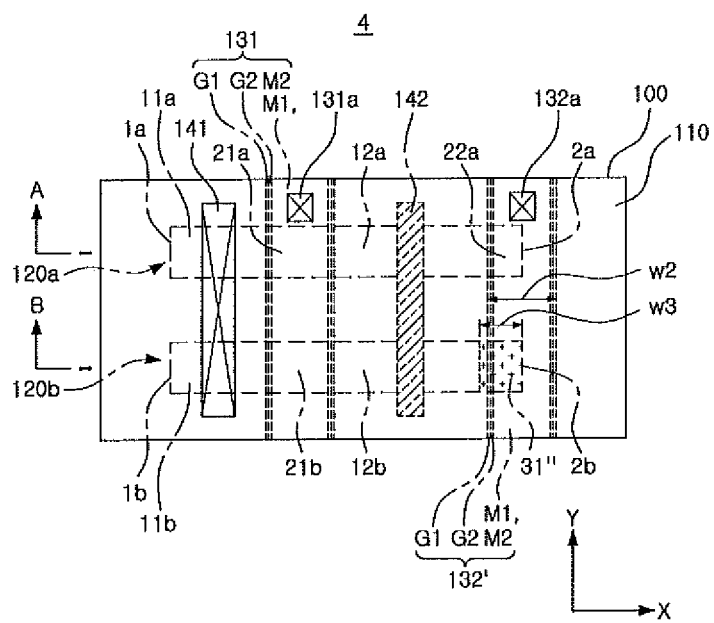
FIG. 12A is a plan view of a semiconductor device according to another example embodiment of the present disclosure.
Figure 12B:
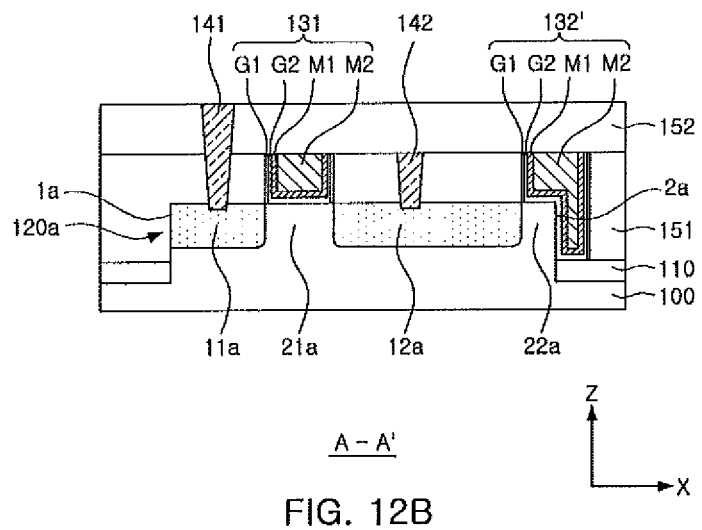
FIG. 12B and FIG. 12C are cross-sectional views of a semiconductor device according to the example embodiment of FIG. 12A.
Figure 12C:
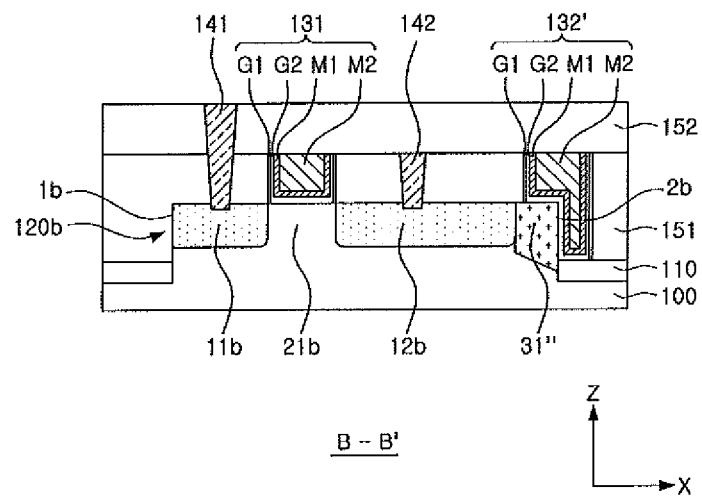

FIG. 12A is a plan view and FIG. 12B through FIG. 12C are cross-sectional views of a semiconductor device 4 according to another example embodiment of the present disclosure.

Referring to FIG. 12A through FIG. 12C, a second gate electrode pattern 132' may cover one of the first and second end surfaces 1a and 2a and one of the first and second end surfaces 1b and 2b of the respective first and second fin type active patterns 120a and 120b. For example, as illustrated in the example embodiment, in a structure in which the second gate electrode pattern 132' is disposed to be adjacent to the respective second end surfaces 2a and 2b of the first and second fin type active patterns 120a and 120b, the second gate electrode pattern 132' may cover the second end surfaces 2a and 2b. The second gate electrode pattern 132' is disposed on the second channel region 22a of the first fin type active pattern 120a and a portion of the device-separating layer 110 adjacent to the second channel region 22a in the first direction (X), and the first gate-separating region 31' of the second fin type active pattern 120b and a portion of the device-separating layer 110 adjacent to the first gate-separating region 31' in the first direction (X).

Comparing FIG. 12B to the example embodiment of FIG. 3A, a contact area between the second gate electrode pattern 132' and the first fin type active pattern 120a may be increased, whereby breakdown of the gate insulating layer G2 may easily occur due to Joule heating at the time of applying a relatively high voltage to the second transistor TR2 for a writing operation. Thus, this example embodiment 4 may be advantageous in terms of a decrease in a level of voltage required for the writing operation.

Additionally, a first gate-separating region 31" may contact one of the first and second end surfaces 1b and 2b of the second fin type active pattern 120b, but is not limited thereto. In addition, unlike the example embodiment of FIG. 3A, a width w3 of the first gate-separating region 31" may be set to be smaller than the width w2 of the second gate electrode pattern 132'.

Figure 13C:
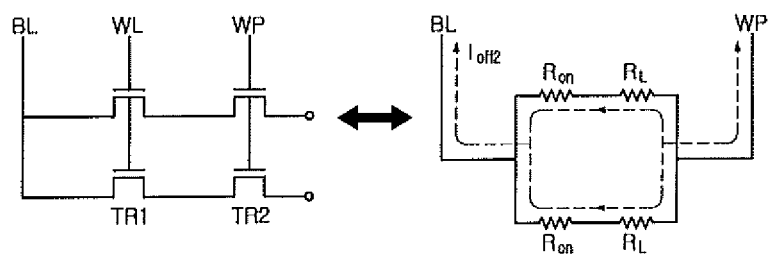
FIG. 13C and FIG. 13D are circuit diagrams of a generic antifuse memory cell.
Figure 13D:
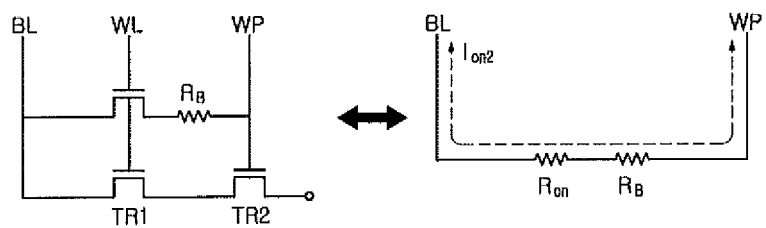

Hereinafter, operations of the semiconductor devices 1, 2, 3 and 4 according to the foregoing example embodiments will be described in detail with reference to FIG. 13A and FIG. 13D.

FIG. 13A and FIG. 13B are circuit diagrams of an antifuse memory cell C in accordance with the semiconductor devices 1, 2, 3 and 4 described in the foregoing example embodiments, and respectively illustrate the memory cell state before and after programming. FIG. 13C and FIG. 13D are circuit diagrams of a general antifuse memory cell and respectively illustrate the memory cell state before and after programming.

The antifuse memory cell C in accordance with the semiconductor devices 1, 2, 3 and 4 as described above may be expressed in the circuit diagrams illustrated in FIG. 13A and FIG. 13B. Specifically, the first gate electrode pattern 131 may be disposed on the respective first channel regions 21a and 21b of the first and second fin type active patterns 120a and 120b and may serve as a gate electrode of the first transistor TR1. In this case, the first transistor TR1 may be expressed as two first transistors. The second gate electrode pattern 132 may be disposed on the second channel region 22a of the first fin type active pattern 120a and may serve as a gate electrode of the second transistor TR2; however, the second gate electrode pattern 132 may be disposed on the first gate-separating region 31, 31' or 31" of the second fin type active pattern 120b and thus, does not serve as the gate electrode. Thus, the second transistor TR2 may be expressed as a single second transistor.

Here, a reading operation will be explained. In a state in which the antifuse memory cell C is not programmed, as illustrated in FIG. 13A, power (e.g. Vwp) applied through a high voltage line WP may cause a leakage current in the gate insulating layer G2 of the second transistor TR2, and the leakage current may flow in a bit line BL via the two first transistors TR1 when TR1 is turned on. In this case, when a leakage resistance of the second transistor TR2 is defined as $R_L$ and an on-resistance of the first transistors TR1 is defined as $R_{on}$, an Off-current $I_{off1}$ may be calculated by the following mathematical formula 1:

$$V_{WP} = I_{off1}(\tfrac{1}{2}R_{on} + R_L) \qquad \text{[Mathematical Formula 1]}$$

Meanwhile, in a state in which the antifuse memory cell C is programmed as illustrated in FIG. 13B, the power applied through the high voltage line WP may flow in the bit line BL via the second transistor TR2 having been changed to a resistor (a resistor having a resistance value $R_B$, where $R_B < R_L$), and the first transistors TR1 in a turn-on state. At this time, an ON-current $I_{on1}$ may be calculated by the following mathematical formula 2:

$$V_{WP} = I_{on1}(\tfrac{1}{2}R_{on} + R_B) \qquad \text{[Mathematical Formula 2]}$$

In a general antifuse memory cell having two first transistors TR1 and two second transistors TR2 (e.g. the number of the first transistors TR1 is identical to that of the second transistors TR2) as illustrated in FIG. 13C, in the case of a state in which the general antifuse memory cell is not programmed, a leakage current may be caused in gate insulating layers of the two second transistors TR2, such that an Off-current $I_{off2}$ may be calculated by the following mathematical formula 3:

$$V_{WP}=I_{off2}\cdot\tfrac{1}{2}(R_{on}+R_L) \quad \text{[Mathematical Formula 3]}$$

According to the description, it can be confirmed that an Off-current value is relatively high as compared to the mathematical formula 1 ($I_{off1}<I_{off2}$).

An ON-current $I_{on2}$ in a state in which the general antifuse memory cell is programmed will be explained. When a relatively high voltage is applied from the high voltage line WP to program the antifuse memory cell, a transistor having a weak gate insulating layer among the two second transistors TR2 may be broken down and be changed to a resistor. Thus, in this case, as illustrated in FIG. 13D, the ON-current $I_{on2}$ may flow in the bit line BL via the second transistors TR2 having been changed to the resistor and the first transistors TR1 connected thereto. The ON-current $I_{on2}$ may be calculated by the following mathematical formula 4:

$$V_{WP}=I_{on2}(R_{on}+R_B) \quad \text{[Mathematical Formula 4]}$$

In this case, the ON-current value is relatively low as compared to the mathematical formula 2 ($I_{on1}>I_{on2}$).

The amount of the Off-current $I_{off}$ may be reduced while the amount of the ON-current $I_{on}$ may be increased, as compared to the case of the general antifuse memory cell. Thus, the ratio of the ON-current $I_{on}$ to the Off-current $I_{off}$, (a characteristic of an antifuse OTP memory device), may be increased, such that a semiconductor device having improved reading operation characteristics may be implemented.

Figure 14A:
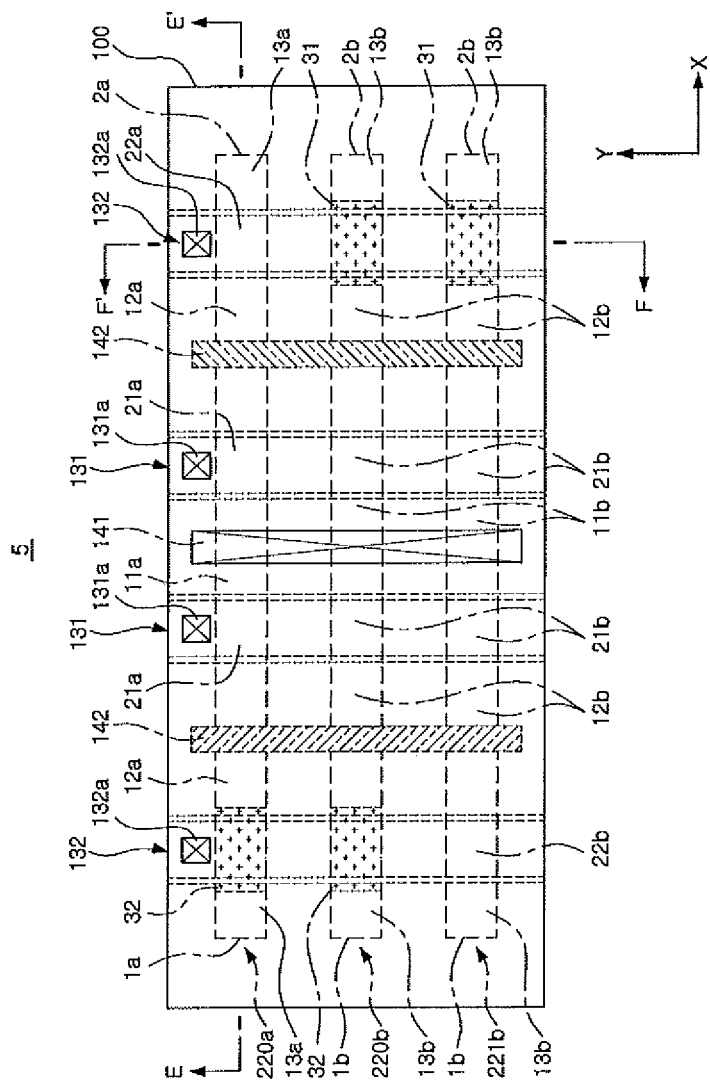
FIG. 14A is a plan view of a semiconductor device according to another example embodiment of the present disclosure.
Figure 14B:
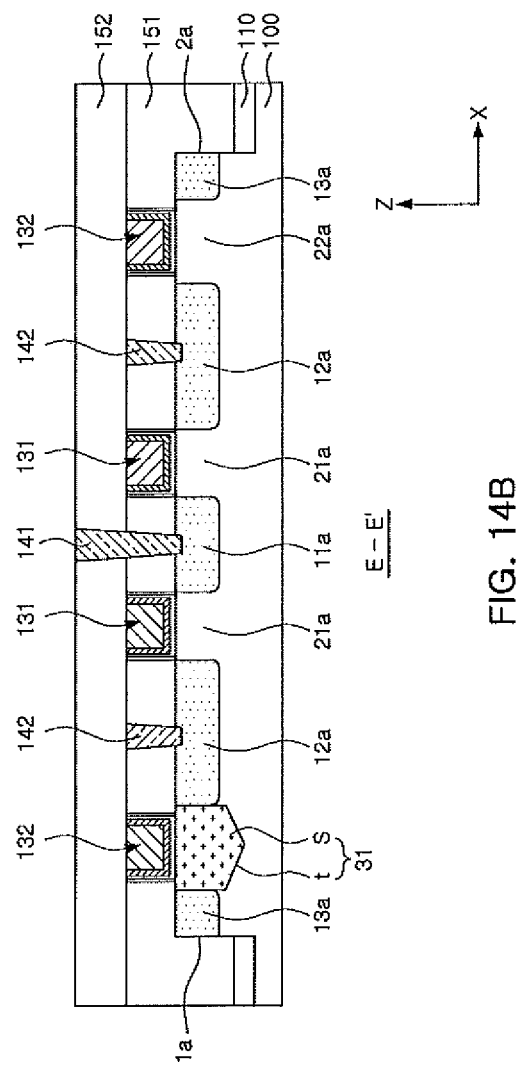
FIG. 14B and FIG. 14C are cross-sectional views of a semiconductor device according to the example embodiment of FIG. 14A.
Figure 14C:
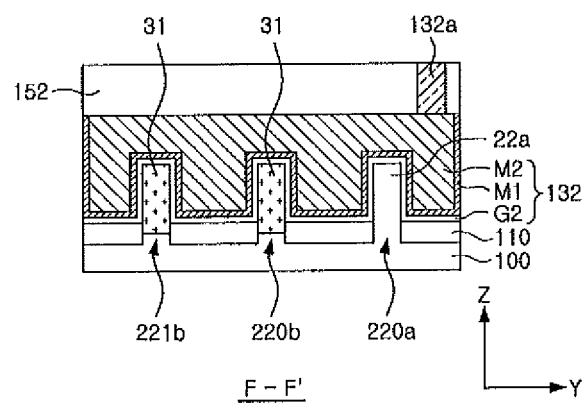
Figure 15:
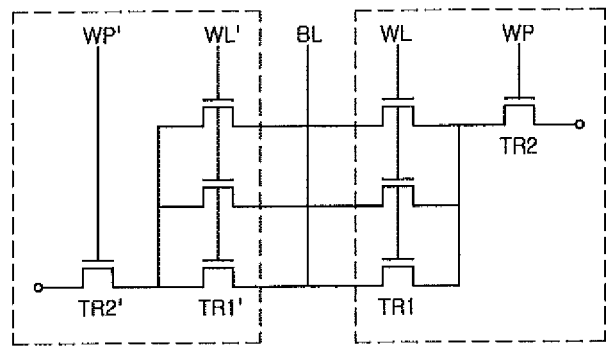
FIG. 15 is a circuit diagram of an antifuse memory cell in accordance with the semiconductor device described in the example embodiment of the present disclosure as illustrated in FIG. 14A through FIG. 14C.

FIG. 14A is a plan view, FIG. 14B and FIG. 14C are cross-section views and FIG. 15 is a circuit diagram, each showing a semiconductor device 5 according to another example embodiment of the present disclosure. FIG. 14B and FIG. 14C are cross-sectional views taken along line E-E' and line F-F' from the plan view of FIG. 14A.

Referring to FIG. 14A through FIG. 14C, the semiconductor device 5 according to another example embodiment of the present disclosure may include first and second fin type active patterns 220a, 220b, and 221b. The present disclosure is not limited to, but for convenience of explanation, hereinafter, a fin type active pattern in which the first gate-separating region 31 is not formed to be adjacent to the second end surface 2a or 2b thereof is referred to as a first fin type active pattern 220a. The remaining fin type active patterns in which the first gate-separating region 31 is formed to be adjacent to the second end surfaces 2a or 2b thereof are referred to as second fin type active patterns 220b and 221b. Thus, based on FIG. 14A, it could be understood that a single first fin type active pattern 220a and two second fin type active patterns 220b and 221b are sequentially arranged in a downward Y direction.

A gate-separating region disposed to be adjacent to the second end surfaces 2b of the second fin type active patterns 220b and 221b refers to the first gate-separating region 31. A gate-separating region disposed to be adjacent to the first end surface 1a or 1b of the first or second fin type active pattern 220a, 220b, or 221b may be defined as a second gate-separating region 32. The second gate-separating region 32 may be disposed in at least one of the first and second fin type active patterns 220a, 220b, and 221b, and may include a trench t formed in the fin type active pattern and an embedded insulator S filling at least a portion of the trench t.

In the example embodiment 5, the respective first and second fin type active patterns 220a, 220b, and 221b may include a plurality of first channel regions 21a and 21b and a plurality of second impurity regions 12a and 12b.

Specifically, as illustrated in FIG. 14A through FIG. 14C, the first fin type active pattern 220a may include the second gate-separating region 32, the second impurity region 12a, the first channel region 21a, the first impurity region 11a, the first channel region 21a, the second impurity region 12a and the second channel region 22a that are sequentially disposed from the first end surface 1a to the second end surface 2a thereof in the first direction (X). In some cases, the third impurity region 13a may be disposed to contact the first and second end surfaces 1a and 2a of the first fin type active pattern 220a.

Similarly, as illustrated in FIG. 14A through FIG. 14C, the second fin type active pattern 220b of the second fin type active patterns 220b and 221b may include the second gate-separating region 32, the second impurity region 12b, the first channel region 21b, the first impurity region 11b, the first channel region 21b, and the second impurity region 12b that are sequentially disposed from the first end surface 1b to the second end surface 2b thereof in the first direction (X). The first gate-separating region 31 may be disposed to be adjacent to the second end surface 2b of the second fin type active pattern 220b. The remaining second fin type active pattern 221b may include the second channel region 22b, the second impurity region 12b, the first channel region 21b, the first impurity region 11b, the first channel region 21b, the second impurity region 12b, and the first gate-separating region 31 that are sequentially disposed from the first end surface 1b to the second end surface 2b thereof in the first direction (X). In some cases, the third impurity region 13b may be disposed to contact the first and second end surfaces 1b and 2b of the second fin type active patterns 220b and 221b.

In this case, the first impurity regions 11a and 11b of the first and second fin type active patterns 220a, 220b, and 221b, and the first contact portion 141 disposed on the first impurity regions 11a and 11b may be arranged in central portions positioned between the first end surfaces 1a and 1b and the second end surfaces 2a and 2b of the respective first and second fin type active patterns 220a, 220b, and 221b.

The semiconductor device 5 according to the example embodiment may include a plurality of first gate electrode patterns 131 and a plurality of second gate electrode patterns 132.

The plurality of first gate electrode patterns 131 may be disposed on the corresponding first channel regions 21a and 21b of the first and second fin type active patterns 220a, 220b, and 221b. Each of the plurality of second gate electrode patterns 132 may be disposed to be adjacent to the first end surfaces 1a and 1b or the second end surfaces 2a and 2b of the respective first and second fin type active patterns 220a, 220b, and 221b. In this case, the plurality of first gate electrode patterns 131 may be disposed between the plurality of second gate electrode patterns 132. Specifically, two first gate electrode patterns 131 may be disposed between two second gate electrode patterns 132.

Each of the plurality of first gate electrode patterns 131 may serve as the gate electrode of the first transistor TR1 for the reading operation, and each of the plurality of second gate electrode patterns 132 may serve as the gate electrode of the second transistor TR2 for the writing operation.

Each of the plurality of second gate electrode patterns 132 may be disposed to cross over the second gate-separating region 32 formed in the first fin type active pattern 220a, the second gate-separating region 32 formed in the second fin type active pattern 220b or 221b, and/or the first gate-separating region 31 formed in the second fin type active pattern

220b or 221b. In this case, a circuit diagram of an antifuse memory cell C of the semiconductor device 5 according to the example embodiment is represented as in FIG. 15.

FIG. 15 is a circuit diagram of the antifuse memory cell C of the semiconductor device 5 according to the example embodiment of the present disclosure. Referring to FIG. 15, the antifuse memory cell C according to the embodiment has a two-bit structure, and a single bit line BL may be connected to three first transistors TR1' positioned on the left side of the circuit diagram and be connected to three first transistors TR1 positioned on the right side of the circuit diagram. The three first transistors TR1' positioned on the left side and the three first transistors TR1 positioned on the right side may be connected to a single second transistor TR2' on the left side and a single second transistor TR2 on the right side, respectively. In this case, in respective bits forming the antifuse memory cell C, a ratio of an ON-current $I_{on}$ to an Off-current $I_{off}$ may be increased, whereby reading operation characteristics may be improved. In an example embodiments, the number of first transistors and second transistors are varied to provide for a wider sensing window (e.g. the difference between Ion and Ioff) at the expense of area.

Figure 16A:
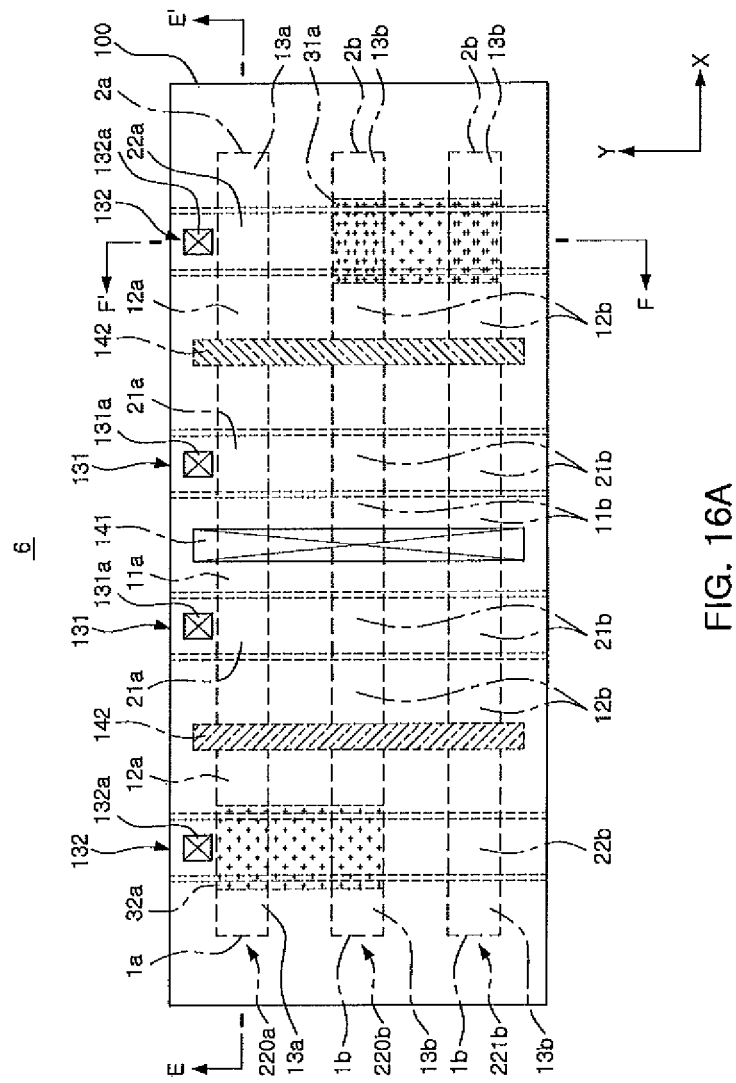
FIG. 16A is a plan view of a semiconductor device according to another embodiment of the present disclosure.
Figure 16B:
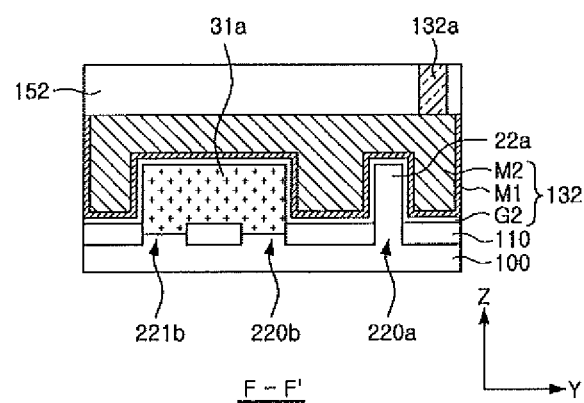
FIG. 16B is a cross-sectional view of a semiconductor device according to the example embodiment of FIG. 16A.

FIG. 16A is a plan view and FIG. 16B is a cross-sectional view of a semiconductor device 6 according to another example embodiment of the present disclosure. FIG. 16B is a cross-sectional view taken along line F-F' from the plan view of FIG. 16A. To avoid redundant description the embodiment of FIG. 16A and FIG. 16B will be described based on the changes it presents to FIG. 14A through FIG. 14C.

Referring to FIG. 16A and FIG. 16B, an embedded insulator of a first gate-separating region 31a provided in one of the plurality of second fin type active patterns 220b and 221b may be extended in the second direction (Y). The embedded insulator may be extended in the second direction (Y) and thus, may fill a trench t of another first gate-separating region 31a provided in the remaining second fin type active pattern 220b or 221b, corresponding thereto. Embedded insulator portions formed in the respective first gate-separating regions 31a provided in the plurality of second fin type active patterns 220b and 221b are integrally formed, thereby simplifying processing.

Similarly, embedded insulator portions of second gate-separating regions 32a formed in different fin type active patterns may be integrally formed. Specifically, the second gate-separating region 32a formed in the first fin type active pattern 220a and the second gate-separating region 32a formed in the second fin type active pattern 220b, positioned to correspond thereto, may have a common, integrally formed embedded insulator.

Figure 17A:
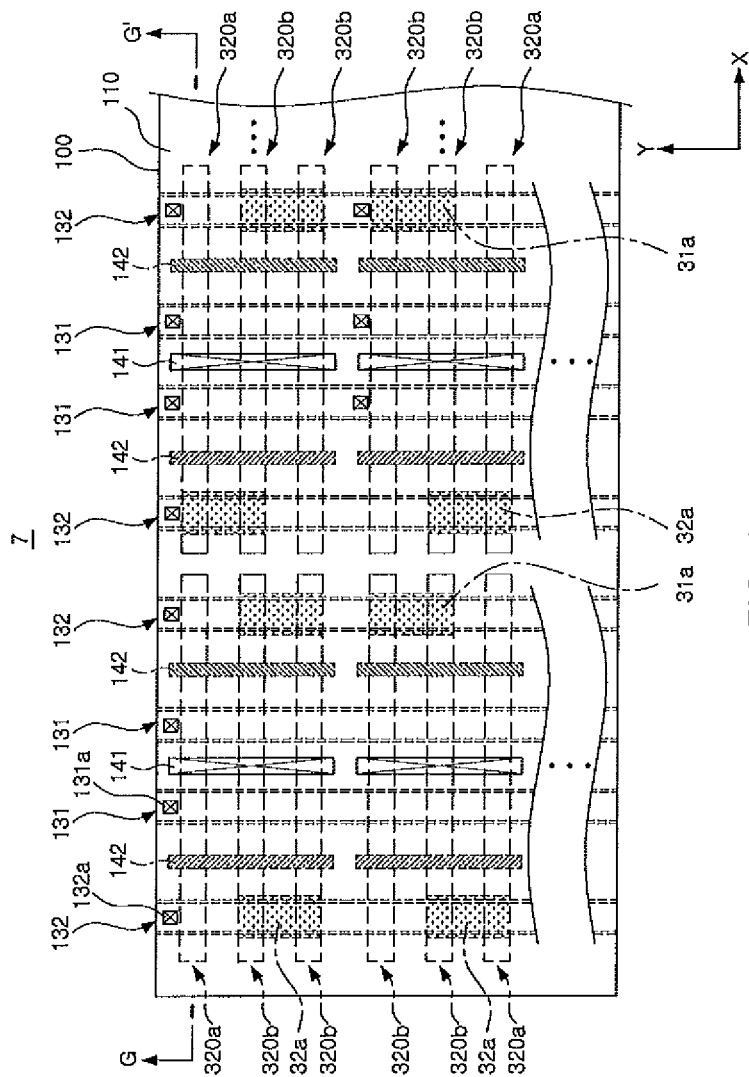
FIG. 17A is a plan view of a semiconductor device according to another embodiment of the present disclosure.
Figure 17B:
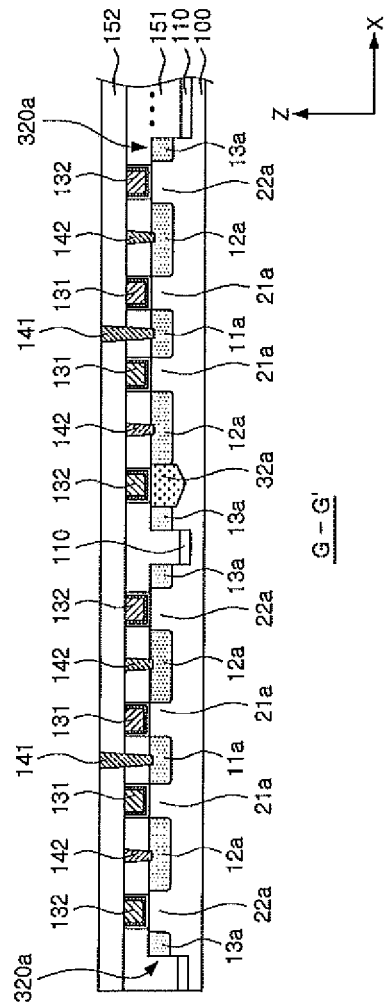
FIG. 17B is a cross-sectional view of a semiconductor device according to the example embodiment of FIG. 17A.

FIG. 17A is a plan view and FIG. 17B is a cross-sectional view of a semiconductor device 7 according to another example embodiment of the present disclosure. FIG. 17B is a cross-sectional view taken along line G-G' from the plan view of FIG. 17A.

Referring to FIG. 17A and FIG. 17B, the semiconductor device 7 may include a plurality of antifuse memory cells. Each of the antifuse memory cells may include at least one first fin type active pattern 320a and at least one second fin type active pattern 320b (the example embodiment illustrates a case in which the sum of amounts of first and second fin type active patterns 320a and 320b is 3) The semiconductor device 7 may include a plurality of first fin type active patterns 320a and a plurality of second fin type active patterns 320b overall.

The semiconductor device 7 may include a plurality of first gate electrode patterns 131 and a plurality of second gate electrode patterns 132. The first and second gate electrode patterns 131 and 132 may be extended in the second direction Y and cross over the plurality of first and second fin type active patterns 320a and 320b.

Referring to FIG. 17B, in the example embodiment, two first fin type active patterns 320a among the plurality of first fin type active patterns 320a may be spaced apart from each other in the first direction (X) by the device-separating layer 110. In a similar manner, two second fin type active patterns 320b among the plurality of second fin type active patterns 320b may be spaced apart from each other in the first direction (X) by the device-separating layer 110. In addition, the first fin type active patterns 320a and the second fin type active patterns 320b may be spaced apart from each other in the first direction (X) by the device-separating layer 110. In this manner, when the first fin type active patterns 320a and/or the second fin type active patterns 320b are spaced apart from each other in the first direction (X) by the device-separating layer 110, a dummy gate pattern for distinguishing the antifuse memory cells may be unnecessary. Thus, a semiconductor device having an increase in degree of integration while having a reduced size thereof may be obtained. In some example embodiments, the dummy gate pattern provides for a uniform local density of gate material to reduce the effects of non-uniform processing caused by process micro-loading.

Figure 18A:
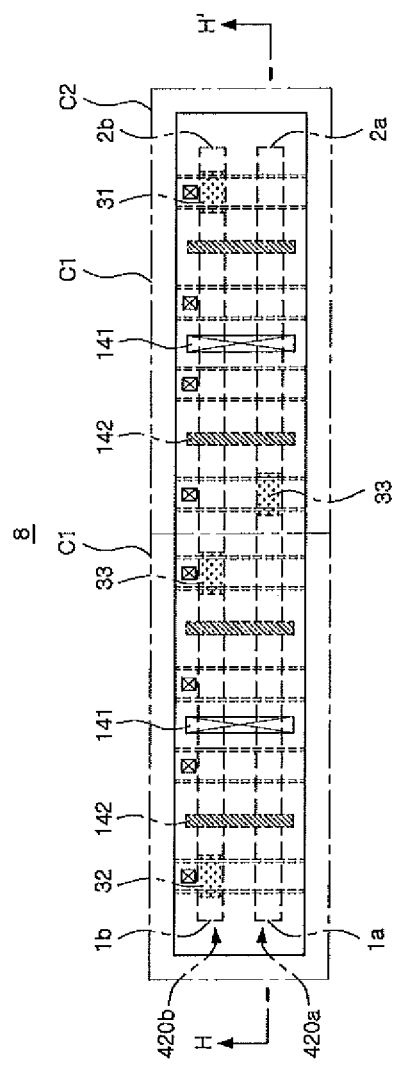
FIG. 18A is a plan view of a semiconductor device according to another example embodiment of the present disclosure.
Figure 18B:
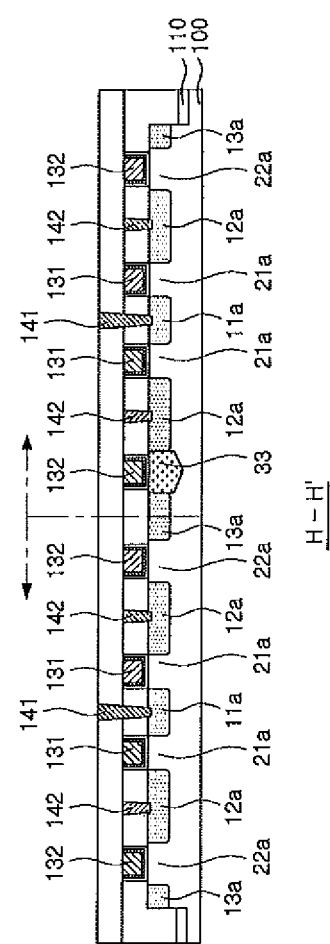
FIG. 18B is a cross-sectional view of a semiconductor device according to the example embodiment of FIG. 18A.
Figure 19:
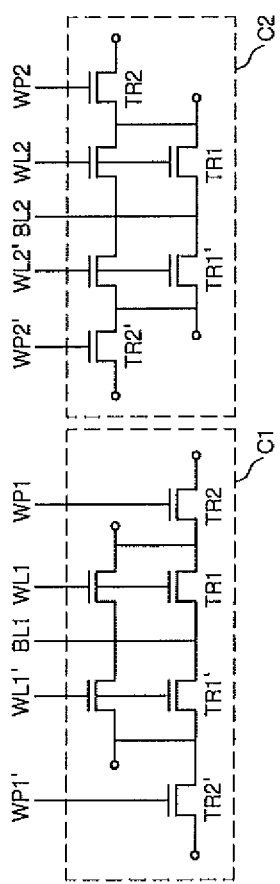
FIG. 19 is a circuit diagram of an antifuse memory cell in accordance with the semiconductor device described in the example embodiment of the present disclosure as illustrated in FIG. 18A and FIG. 18B.

FIG. 18A is a plan view, FIG. 18B is a cross-sectional view and FIG. 19 is a circuit diagram of a semiconductor device 8 according to another example embodiment of the present disclosure.

FIG. 18B is a cross-sectional view taken along line H-H' from the plan view of FIG. 18A. To avoid redundant description the example embodiment of FIG. 18A and FIG. 18B will be described based on the changes it presents to FIG. 17A through FIG. 17B.

A fin type active pattern in which the first gate-separating region 31 is not formed to be adjacent to the second end surface 2a or 2b thereof is referred to as a first fin type active pattern 420a, and another fin type active pattern in which the first gate-separating region 31 is formed to be adjacent to the second end surface 2a or 2b thereof is referred to as a second fin type active pattern 420b. Thus, based on FIG. 18A, it could be understood that a single second fin type active pattern 420b and a single first fin type active pattern 420a are arranged in a downward direction.

Here, in the case that a gate-separating region disposed to be adjacent to the second end surface 2b of the second fin type active pattern 420b refers to the first gate-separating region 31, a gate-separating region disposed to be adjacent to the first end surface 1a or 1b of the first or second fin type active pattern 420a or 420b may be defined as the second gate-separating region 32. The second gate-separating region 32 may be disposed in at least one of the first and second fin type active patterns 420a and 420b, and may include a trench t formed in the fin type active pattern and an embedded insulator S filling at least a portion of the trench t.

Referring to FIG. 18A, based on the premise described above, the second fin type active pattern 420b may include the second gate-separating region 32 adjacent to the first end surface 1b thereof and the first gate-separating region 31 adjacent to the second end surface 2b thereof. FIG. 18A illustrates a case in which the first fin type active pattern 420a does not include the first and second gate-separating regions 31 and 32.

In the example embodiment, each of the first and second fin type active patterns 420a and 420b may further include a plurality of first impurity regions 11a and 11b. A plurality of first contact portions 141 may be disposed on the plurality of first impurity regions 11a and 11b of the respective first and second fin type active patterns 420a and 420b.

Each of the first and second fin type active patterns 420a and 420b may include a third gate-separating region 33 disposed between the plurality of first impurity regions 11a and 11b. The third gate-separating region 33 may include a trench t and an embedded insulator S filling at least a portion of the trench t.

More specifically, explaining the second fin type active pattern 420b with reference to FIG. 18A, the second fin type active pattern 420b may include the third impurity region, the second gate-separating region 32, the second impurity region, the first channel region, the first impurity region 11b, the first channel region, the second impurity region, the third gate-separating region 33, the third impurity region, the second channel region, the second impurity region, the first channel region, the first impurity region 11b, the first channel region, the second impurity region, the first gate-separating region 31 and the third impurity region that are sequentially disposed from the first end surface 1b to the second end surface 2b thereof in the first direction (X). The third impurity regions adjacent to the first and second end surfaces 1b and 2b may be omitted if necessary.

Moreover, explaining the first fin type active pattern 420a with reference to FIG. 18A and FIG. 18B, the first fin type active pattern 420a may include the third impurity region 13a, the second channel region 22a, the second impurity region 12a, the first channel region 21a, the first impurity region 11a, the first channel region 21a, the second impurity region 12a, the second channel region 22a, the third impurity region 13a, the third gate-separating region 33, the second impurity region 12a, the first channel region 21a, the first impurity region 11a, the first channel region 21a, the second impurity region 12a, the second channel region 22a, and the third impurity region 13a that are sequentially disposed from the first end surface 1a to the second end surface 2a thereof in the first direction (X). Similarly, the third impurity regions 13a adjacent to the first and second end surfaces 1a and 2a may be omitted depending on embodiments.

Referring to FIG. 18A, FIG. 18B, and FIG. 19, it can be understood that the semiconductor device 8 may include a plurality of antifuse memory cells C1 and C2 respectively including first transistors TR1 and TR1' and second transistors TR2 and TR2' connected to word lines WL1, WL1', WL2, and WL2' and high voltage lines WP1, WP1', WP2, and WP2', and bit lines BL and BL2.

The example embodiment illustrated in FIG. 18A, FIG. 18B, and FIG. 19 is different from that of FIG. 17A and FIG. 17B, in that instead of the device-separating layer 110, the third gate-separating region 33 is used in order to distinguish the antifuse memory cells C1 and C2. In this case, unlike the embodiment of FIG. 17A and FIG. 17B, because a space required for forming the device-separating layer 110 by which portions of the first fin type active pattern 420a and/or the second fin type active pattern 420b are spaced apart from each other may be unnecessary, a degree of integration of the semiconductor device may be further increased. The respective third gate-separating regions 33 of the first and second fin type active patterns 420a and 420b may be arranged in central portions positioned between the first end surfaces 1a and 1b and the second end surfaces 2a and 2b of the respective first and second fin type active patterns 420a and 420b, but the present disclosure is not limited thereto.

Figure 20:
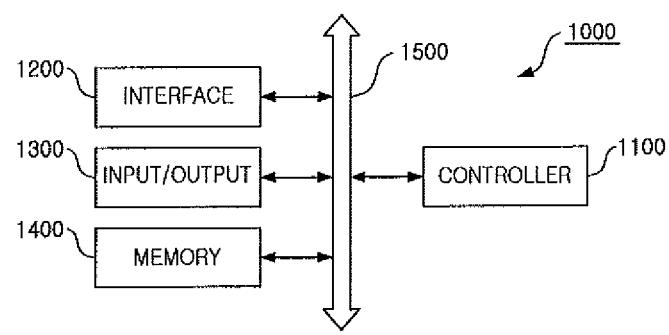
FIG. 20 is a block diagram of an electronic device including the semiconductor device according to an example embodiment of the present disclosure.
Figure 21:
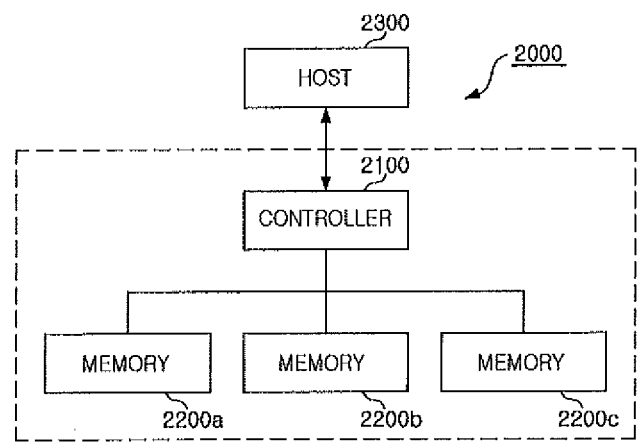
FIG. 21 is a block diagram of a memory device including the semiconductor device according to an example embodiment of the present disclosure.

FIG. 20 and FIG. 21 are block diagrams of an electronic device 1000 and a memory device 2000 including any one or a combination of the semiconductor device example embodiments 1, 2, 3, 4, 5, 6, 7, or 8.

Referring to FIG. 20, the electronic device 1000 according to the embodiment of the present disclosure may include a controller 1100, an interface 1200, an input/output device 1300, a memory 1400, and the like. The controller 1100, the interface 1200, the input/output device 1300, the memory 1400, and the like may be connected to one another via a bus 1500 providing a path on which data is transferred.

The controller 110 may include at least one element such as a microprocessor, a digital signal processor, a microcontroller or the like. The memory 1400 may include an element able to read and write data in various manners. The memory 1400 may include a non-volatile memory and may have at least one of the semiconductor device example embodiments 1, 2, 3, 4, 5, 6, 7, and 8.

The input/output device 1300 may include a keypad, a keyboard, a touch screen device, a display device, an audio input/output module and the like. The interface 1200 may be a module transmitting and receiving data over a communications network, and examples thereof may include an antenna, a wired or wireless transceiver and the like. In addition to components illustrated in FIG. 20, the electronic device 1000 may further include an application chipset, an image capturing device and the like. The electronic device 1000 illustrated in FIG. 20 is not limited in terms of the category thereof. Examples of the electronic device 1000 may include various devices such as a personal digital assistant (PDA), a portable computer, a mobile phone, a walkie-talkie, a laptop computer, a memory card, a portable media player, a tablet PC and the like.

FIG. 21 is a block diagram of the memory device 2000 including the semiconductor 1, 2, 3, 4, 5, 6, 7, or 8 according to an example embodiment of the present disclosure. Referring to FIG. 21, the memory device 2000 according to the example embodiment may include a controller 2100 communicating with a host 2300, and memories 2200a, 2200b and 2200c storing data. The respective memories 2200a, 2200b and 2200c may include a non-volatile memory and may have at least one of the semiconductors 1, 2, 3, 4, 5, 6, 7, and 8 according to the foregoing example embodiments of the present disclosure.

Examples of the host 2300 communicating with the controller 2100 may include various electronic apparatuses on which the memory device 2000 is mounted. For example, the host 2300 may be, for example, a smartphone, a digital camera, a desktop computer, a laptop computer, a media player or the like. The controller 2100 may receive a data writing or data reading request transferred from the host 2300 to store data in the memories 2200a, 2200b and 2200c or generate a command (CMD) for retrieving data from the memories 2200a, 2200b and 2200c.

Figure 22:
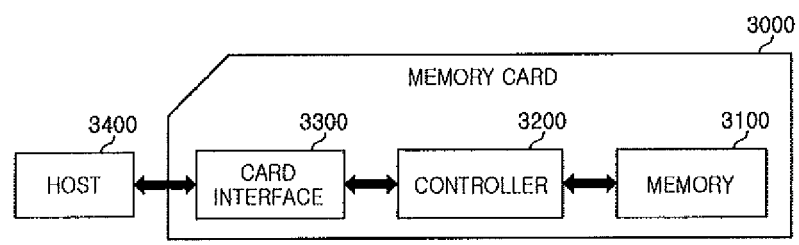
FIG. 22 is a block diagram of a memory card 3000 including the semiconductor device according to an example embodiment of the present disclosure.

FIG. 22 is a block diagram of a memory card 3000 including the semiconductor 1, 2, 3, 4, 5, 6, 7, or 8 according to an example embodiment of the present disclosure.

Referring to FIG. 22, the memory card 3000 may include a memory 3100, a controller 3200, and a card interface 3300. The controller 3200 may control data exchange between the memory 3100 and the card interface 3300. The memory 3100 may be a non-volatile memory and include at least one of the semiconductors 1, 2, 3, 4, 5, 6, 7, and 8 according to the foregoing example embodiments of the present disclosure.

If necessary, the card interface 3300 may be a secure digital (SD) card interface or a multimedia card (MMC) interface, but is not limited thereto. According to a protocol of a host 3400, the card interface 3300 may interface data exchange between the host 3400 and the controller 3200.

When the memory card 3000 is connected to the host 3400 such as a PC, a table PC, a digital camera, a digital audio player, a mobile phone, console video game hardware or a digital set top box, the host 3400 may receive data stored in the memory 3100 or transmit data to be stored in memory 3100 through the card interface 3300 and the controller 3200.

As set forth above, according to example embodiments of the present disclosure, a semiconductor device having improved reading operation characteristics by increasing a ratio of an ON-current to an Off-current, a characteristic of an antifuse OTP memory device, may be provided.

According to example embodiments of the present disclosure, a semiconductor device having an increased device integration while having a reduced size, due to the elimination of a dummy gate pattern.

While example embodiments have been shown and described above, it will be apparent to those skilled in the art that modifications and variations could be made without departing from the spirit and scope of the present disclosure as defined by the appended claims.

What is claimed is:

1. A semiconductor device comprising:
   a substrate;
   at least one first fin active pattern and at least one second fin active pattern, the first fin active pattern and the second fin active pattern extended in a first direction on the substrate and including a first impurity region and a second impurity region;
   a first gate electrode and a second gate electrode on the first fin active pattern and the second fin active pattern;
   a first contact portion electrically connected to the first impurity region of each of the first fin active pattern and the second fin active pattern; and
   a second contact portion electrically connecting the second impurity region of the first fin active pattern to the second impurity region of the second fin active pattern;
   wherein the second fin active pattern includes a first gate-separating region including a trench and an embedded insulator filling at least a portion of the trench, and the second gate electrode is extended in a second direction different from the first direction to cross the first gate-separating region.

2. The semiconductor device of claim 1, wherein each of the first fin active pattern and the second fin active pattern further includes a first channel region between the first impurity region and the second impurity region.

3. The semiconductor device of claim 2, wherein the first gate electrode is extended in the second direction to cross the first fin active pattern and the second fin active pattern, and is on the first channel of each of the first fin active pattern and the second fin active pattern.

4. The semiconductor device of claim 2, wherein the first fin active pattern further includes a second channel region, the second impurity region of the first fin active pattern is between the first channel region and the second channel region of the first active pattern, and
the second impurity region of the second fin active pattern is between the first channel region and the first gate-separating region of the second fin active pattern.

5. The semiconductor device of claim 4, wherein the second gate electrode crosses the first fin active pattern and the second fin active pattern and is on the second channel region of the first fin active pattern and the first gate-separating region of the second fin active pattern.

6. The semiconductor device of claim 5, wherein each of the first fin active pattern and the second fin active pattern further includes a third impurity region,
the second channel region of the first fin active pattern is between the second impurity region and the third impurity region of the first fin active pattern, and
the first gate-separating region of the second fin active pattern is between the second impurity region and the third impurity region of the second fin active pattern.

7. The semiconductor device of claim 5, wherein the second fin active pattern has a first end surface and a second end surface opposing the first end surface in the first direction, and
the first gate-separating region of the second fin active pattern contacts one of the first end surface and the second end surface.

8. The semiconductor device of claim 5, wherein the second fin active pattern has a first end surface and a second end surface opposing the first end surface in the first direction, and
the second gate electrode covers one of the first end surface and the second end surface.

9. The semiconductor device of claim 5, wherein the second impurity region of the second fin active pattern has a first depth from an upper surface of the second fin active pattern, and the trench of the first gate-separating region has a second depth greater than the first depth.

10. The semiconductor device of claim 2, wherein each of the first fin active pattern and the second fin active pattern has a first end surface and a second end surface opposing the first end surface in the first direction, and includes a plurality of first channel regions and a plurality of second impurity regions, and
the first impurity region of each of the first fin active pattern and the second fin active pattern is arranged in a central portion positioned between the first end surface and the second end surface of each of the first fin active pattern and the second fin active pattern.

11. The semiconductor device of claim 10, wherein the semiconductor device includes a plurality of first gate electrodes and a plurality of second gate electrodes,
the plurality of first gate electrodes are on the plurality of respective first channel regions of each of the first fin active pattern and the second fin active pattern, and
the plurality of second gate electrodes are adjacent to the respective first end surface or the second end surface of each of the first fin active pattern and the second fin active pattern.

12. The semiconductor device of claim 11, wherein the first gate-separating region is adjacent to the second end surface of the second fin type active pattern, and
at least one of the first fin active pattern and the second fin active pattern includes a second gate-separating region adjacent to the first end surface and including a trench and an embedded insulator filling at least a portion of the trench.

13. The semiconductor device of claim 10, wherein each of the first fin active pattern and the second fin active pattern has the first end surface and the second end surface opposing the first end surface in the first direction, and includes the plurality of first channel regions and a plurality of first impurity regions and second impurity regions,
each of the first fin active patterns and the second fin active patterns includes a plurality of first contact portions on the plurality of first impurity regions, and
each of the first fin active patterns and the second fin active patterns includes a third gate-separating region between the plurality of first impurity regions and including a trench and an embedded insulator filling at least a portion of the trench.

14. The semiconductor device of claim 13, wherein the third gate-separating region of each of the first fin active patterns and the second fin active patterns is arranged in a central portion positioned between the first end surface and the second end surface of each of the first fin active patterns and the second fin active patterns.

15. The semiconductor device of claim 1, wherein a bottom surface of the trench of the first gate-separating region is positioned on a level lower than one surface of the substrate on which the second fin active pattern is disposed.

16. The semiconductor device of claim 1, further comprising: a device-separating layer on the substrate,
wherein a bottom surface of the trench of the first gate-separating region is at a level higher than that of one surface of the device-separating layer adjacent to the substrate, and is at a level lower than that of an opposing surface of the device-separating layer, opposing the one surface thereof.

17. The semiconductor device of claim 1, further comprising: a device-separating layer disposed on the substrate,
wherein a bottom surface of the trench of the first gate-separating region is at a level higher than those of one surface of the device-separating layer adjacent to the substrate and an opposing surface of the device-separating layer, opposing the one surface thereof.

18. A semiconductor device comprising:
a substrate;
at least one first active pattern and at least one second active pattern, the first active pattern and the second active pattern extended in a first direction on the substrate and including a first impurity region and a second impurity region; and
a first gate electrode and a second gate electrode on the first active pattern and the second active pattern,
wherein the second active pattern has a first gate-separating region including a trench and an embedded electrical insulation region filling at least a portion of the trench,
wherein the second gate electrode is extended in a second direction different from the first direction to cross the first gate-separating region, and
wherein the second gate electrode is directly on the first gate-separating region.

19. A non-volatile memory comprising:
a plurality of access transistors, each having a first common gate, a first common source connected to a bit line, and a first common drain; and
a plurality of programmable transistors, each having a second common gate, and a second common source connected to the first common drain, at least one and less than all, of the plurality of programmable transistors configured to form a resistive short between the second common gate and the second common source upon application of a high voltage to the second common gate,
wherein a first number of the plurality of programmable transistors is equal to a second number of the plurality of access transistors,
wherein at least one, and less than all, of the programmable transistors includes a respective gate separation region configured to prevent a formation of the resistive short between the respective second common gate and the second common source.

* * * * *